US012727131B2

(12) United States Patent
Matsuoka et al.

(10) Patent No.: US 12,727,131 B2
(45) Date of Patent: Sep. 1, 2026

(54) POWER CONVERSION DEVICE

(71) Applicant: DENSO CORPORATION, Kariya-city (JP)

(72) Inventors: Tetsuya Matsuoka, Kariya-city (JP); Yuta Hashimoto, Kariya-city (JP); Tomoki Kozawa, Kariya-city (JP); Kazuya Takeuchi, Kariya-city (JP); Shinji Takai, Kariya-city (JP); Takahiro Shimizu, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 239 days.

(21) Appl. No.: 18/594,278

(22) Filed: Mar. 4, 2024

(65) Prior Publication Data

US 2024/0215211 A1 Jun. 27, 2024

Related U.S. Application Data

(63) Continuation of application No. PCT/JP2022/036295, filed on Sep. 28, 2022.

(30) Foreign Application Priority Data

Oct. 15, 2021 (JP) ................................ 2021-169737
Sep. 14, 2022 (JP) ................................ 2022-146481

(51) Int. Cl.
*H05K 7/20* (2006.01)
*H02M 7/00* (2006.01)
*H02M 7/537* (2006.01)

(52) U.S. Cl.
CPC ........ *H05K 7/20927* (2013.01); *H02M 7/003* (2013.01); *H02M 7/537* (2013.01)

(58) Field of Classification Search
CPC .......... H02M 1/00; H02M 1/08; H02M 7/003; H02M 7/537; H05K 1/14322; H05K 1/20263; H05K 1/2029; H05K 1/20327; H05K 1/20509; H05K 1/209; H05K 1/20927; H05K 1/20936; H05K 5/04; H05K 1/0203; H01L 23/3114; H01L 23/3675; H01L 23/40; H01L 23/473;
(Continued)

(56) References Cited

U.S. PATENT DOCUMENTS 6,351,384 B1 * 2/2002 Daikoku ................ F28F 13/12 361/689
11,382,241 B2 * 7/2022 Gao .................. H05K 7/20772
(Continued)

FOREIGN PATENT DOCUMENTS

JP 2019-68533 A 4/2019

*Primary Examiner* — Amir A Jalali
(74) *Attorney, Agent, or Firm* — Oliff PLC

(57) ABSTRACT

The power conversion device has a case, a semiconductor module, a first cooler that cools the semiconductor module from one side, a second cooler that cools the semiconductor module from the back side, and a coupling pipe that couples a flow path of the first cooler with a flow path of the second cooler. A flow rate of the refrigerant is made different between the flow paths, and the flow path having a larger flow rate is larger in cross-sectional area than the flow path having a smaller flow rate. The first cooler having a wider flow path is formed by a part of the case that houses the semiconductor module, and the second cooler having a narrower flow path is housed in the case together with the semiconductor module.

14 Claims, 14 Drawing Sheets

(58) Field of Classification Search
CPC ......... H01L 23/49562; H01L 23/49568; H01L 23/49575; H01L 25/0655; H01L 25/072; H01L 25/117; H01L 25/165; H03K 5/203; H02K 9/19; H02K 11/30
See application file for complete search history.

(56) References Cited

U.S. PATENT DOCUMENTS

| | | | | |
|---|---|---|---|---|
| 12,120,857 | B2 * | 10/2024 | Siewert | H05K 7/209 |
| 12,341,082 | B2 * | 6/2025 | Gao | F28F 3/14 |
| 2014/0339693 | A1 * | 11/2014 | Hotta | H01L 23/473<br>257/714 |
| 2016/0183407 | A1 * | 6/2016 | Katsumata | H05K 1/181<br>361/699 |
| 2017/0223875 | A1 | 8/2017 | Tsuyuno et al. | |
| 2018/0184543 | A1 * | 6/2018 | Ando | H01L 23/473 |
| 2018/0261527 | A1 * | 9/2018 | Takeuchi | H01L 23/427 |
| 2018/0332739 | A1 * | 11/2018 | Takeuchi | H01L 23/473 |
| 2019/0096784 | A1 * | 3/2019 | Katayama | F28D 1/0366 |
| 2019/0360766 | A1 * | 11/2019 | Kenney | F28F 3/027 |
| 2020/0075452 | A1 * | 3/2020 | Matsuzawa | H01L 23/3677 |
| 2020/0144156 | A1 * | 5/2020 | Mrad | H01L 25/18 |
| 2020/0177101 | A1 * | 6/2020 | Yamahira | H02M 7/003 |
| 2021/0175771 | A1 | 6/2021 | Tanabe et al. | |
| 2023/0011539 | A1 * | 1/2023 | Imai | A61L 2/26 |
| 2023/0040828 | A1 * | 2/2023 | Gao | H01L 21/4882 |
| 2023/0188007 | A1 * | 6/2023 | Sano | H02K 11/33<br>310/68 D |
| 2024/0030100 | A1 * | 1/2024 | Ruppert | H01L 21/4871 |
| 2024/0186911 | A1 * | 6/2024 | Kawashima | H02M 7/48 |

* cited by examiner 10U, 10
10V, 10
10W, 10
4
1
12
12
12
8
5
13
10H
14
11
3a
U
3
2
6
V
W
3a
3a
9
10L
Drive Circuit
7

51
62, 60
31H
41
40
47
4
24
20
21
22
30U, 30
32
31L
31L
34P
34N
30V, 30
X
X
30W, 30
35
32d
91P
91N
90
23
61, 60
50
31H
32c
X
Y

POWER CONVERSION DEVICE

CROSS REFERENCE TO RELATED APPLICATIONS

The present application is a continuation application of International Patent Application No. PCT/JP2022/036295 filed on Sep. 28, 2022, which designated the U.S. and claims the benefit of priority from Japanese Patent Application No. 2021-169737 filed on Oct. 15, 2021, and Japanese Patent Application No. 2022-146481 filed on Sep. 14, 2022. The entire disclosures of all of the above applications are incorporated herein by reference.

TECHNICAL FIELD

The present disclosure relates to a power conversion device.

BACKGROUND ART

A power conversion device includes a power module, two cooling flow paths (coolers) arranged to sandwich the power module, and an intermediate pipe connecting the two cooling flow paths.

SUMMARY

According to at least one embodiment of the present disclosure, a power conversion device includes a semiconductor module, a case, a first cooler, a second cooler and a coupling part. The semiconductor module forms a power conversion circuit. The case has a first wall part on which the semiconductor module is disposed, and a second wall part that is connected to the first wall part and defines a housing space together with the first wall part. The first cooler is configured to cool the semiconductor module. The first cooler includes the first wall part and a first flow path formed inside the first wall part. The first flow path allows a refrigerant to flow through the first flow path. The second cooler is disposed on the semiconductor module in the housing space and configured to cool the semiconductor module. The second cooler has a second flow path allowing the refrigerant to flow through the second flow path. The semiconductor module is between the first cooler and the second cooler. The coupling part has a coupling flow path communicating with the first flow path and the second flow path. A flow rate of the refrigerant flowing through the first flow path is larger than a flow rate of the refrigerant flowing through the second flow path. A cross-sectional area of the first flow path is larger than a cross-sectional area of the second flow path.

BRIEF DESCRIPTION OF DRAWINGS

The details of one or more embodiments are set forth in the accompanying drawings and the description below. Other features and advantages will be apparent from the description and drawings, and from the claims.

DETAILED DESCRIPTION

Figure 1:
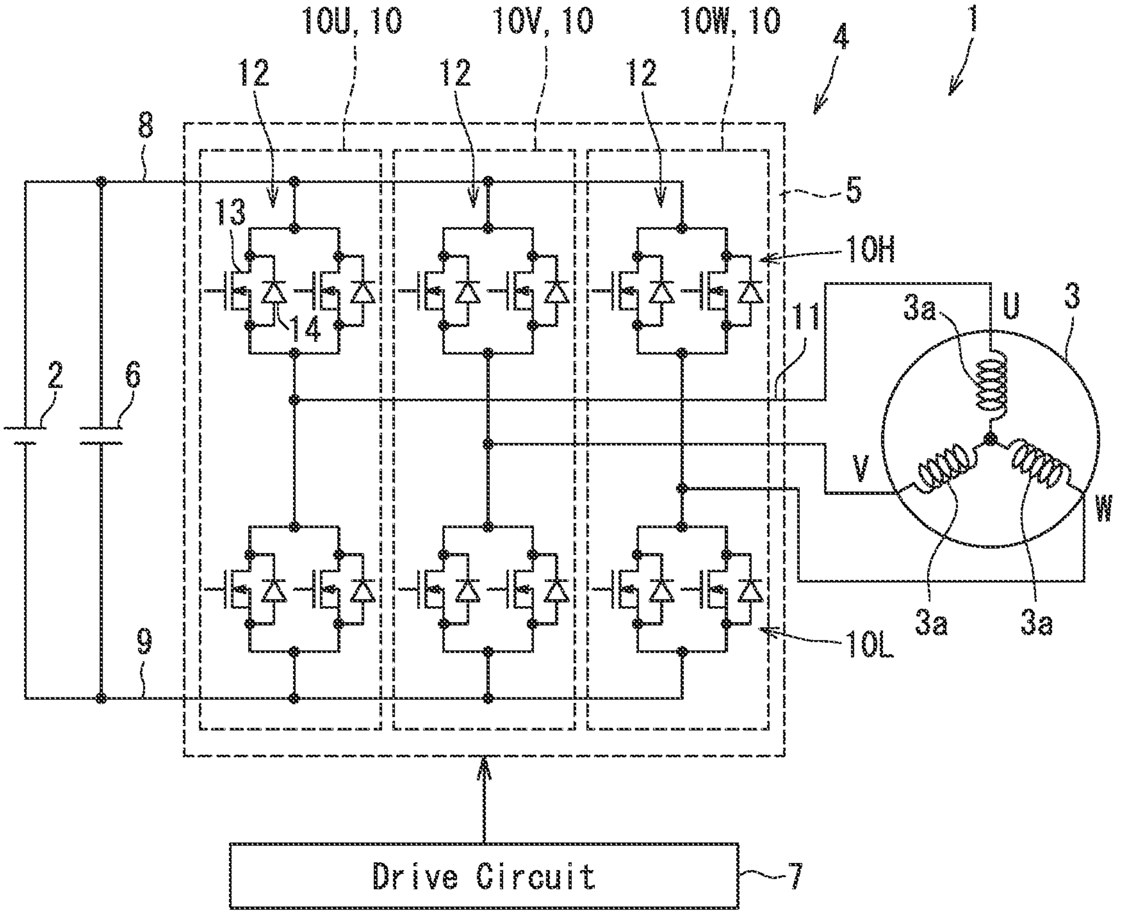
FIG. 1 illustrates a circuit configuration and a drive system of a power conversion device according to a first embodiment.

To begin with, examples of relevant techniques will be described. A power conversion device according to a comparative example includes a power module, two cooling flow paths (coolers) arranged to sandwich the power module, and an intermediate pipe connecting the two cooling flow paths. The contents of the literature (JP 2019-068533 A) are incorporated by reference as explanation of the technical elements of this description.

According to the comparative example, the cooler is considered to be made thinner in a stacking direction of the power module and the cooler to reduce size, i.e., height, of the power conversion device. However, this makes the flow path to be narrower, leading to an increase in pressure loss.

In contrast, according to the present disclosure, a power conversion device can be made lower in height while suppressing an increase in pressure loss.

A power conversion device according to the present disclosure includes a semiconductor module, a case, a first cooler, a second cooler and a coupling part. The semiconductor module forms a power conversion circuit. The case has a first wall part on which the semiconductor module is disposed, and a second wall part that is connected to the first wall part and defines a housing space together with the first wall part. The first cooler is configured to cool the semiconductor module. The first cooler includes the first wall part and a first flow path formed inside the first wall part. The first flow path allows a refrigerant to flow through the first flow path. The second cooler is disposed on the semiconductor module in the housing space and configured to cool the semiconductor module. The second cooler has a second flow path allowing the refrigerant to flow through the second flow path. The semiconductor module is between the first cooler and the second cooler. The coupling part has a coupling flow path communicating with the first flow path and the second flow path. A flow rate of the refrigerant flowing through the first flow path is larger than a flow rate of the refrigerant flowing through the second flow path. A cross-sectional area of the first flow path is larger than a cross-sectional area of the second flow path.

According to the disclosed power conversion device, the flow rate of the refrigerant is made different between the first flow path and the second flow path, and the cross-sectional area of the first flow path with a larger flow rate is made larger than that of the second flow path. In other words, the second flow path with a smaller flow rate is made narrower, and the first flow path with the larger flow rate is made wider. The first cooler with the wider flow path is formed by a part of the case that houses the semiconductor module, and the second cooler with the narrower flow path is housed in the case together with the semiconductor module. As a result, the power conversion device can be reduced in height while suppressing an increase in pressure loss.

Hereinafter, multiple embodiments will be described with reference to the drawings. Elements corresponding to each other among the embodiments are assigned the same numeral and their descriptions may be omitted. When only a part of a component is described in an embodiment, the other part of the component can be relied on the component of a preceding embodiment. Furthermore, in addition to the combination of components explicitly described in each embodiment, it is also possible to combine components from different embodiments, as long as the combination poses no difficulty, even if not explicitly described.

The power conversion devices of the present embodiments are each applied, for example, to a moving vehicle that uses a rotating electric machine as a driving source. The moving vehicle includes, for example, electric vehicles such as a battery electric vehicle (BEV), a hybrid electric vehicle (HEV), and a plug-in hybrid electric vehicle (PHEV), air vehicle such as a drone and an electric vertical takeoff and landing vehicle (eVTOL), ships, construction machinery, and agricultural machinery. An example where the power conversion device is applied to a vehicle will be described below.

First Embodiment

First, a schematic configuration of a vehicle drive system is described with reference to FIG. 1.

As illustrated in FIG. 1, a vehicle drive system 1 includes a DC power supply 2, a motor generator 3, and a power conversion device 4.

The DC power supply 2 is a DC voltage source configured of a chargeable/dischargeable secondary battery. Examples of the secondary battery include a lithium ion battery, a nickel-hydrogen battery, and an organic radical battery. The motor generator 3 is a three-phase AC rotating electric machine. The motor generator 3 functions as a traveling driving source of a vehicle, i.e., an electric motor. The motor generator 3 functions as a generator during regeneration. The power conversion device 4 performs power conversion between the DC power supply 2 and the motor generator 3.

FIG. 1 illustrates a circuit configuration of the power conversion device 4. The power conversion device 4 includes at least a power conversion circuit. The power conversion circuit of this embodiment is an inverter 5. The power conversion device 4 may further include a smoothing capacitor 6, a drive circuit 7, and the like.

The smoothing capacitor 6 mainly smooths DC voltage supplied from the DC power supply 2. The smoothing capacitor 6 is connected to a P line 8, a power line on the high potential side, and to an N line 9, a power line on the low potential side. The P line 8 is connected to the positive electrode of the DC power supply 2, and the N line 9 is connected to the negative electrode of the DC power supply 2. A positive electrode of the smoothing capacitor 6 is connected to the P line 8 between the DC power supply 2 and the inverter 5. A negative electrode of the smoothing capacitor 6 is connected to the N line 9 between the DC power supply 2 and the inverter 5. The smoothing capacitor 6 is connected in parallel to the DC power supply 2.

The inverter 5 is a DC-AC conversion circuit. The inverter 5 converts DC voltage into three-phase AC voltage according to switching control by an undepicted control circuit, and outputs the three-phase AC voltage to the motor generator 3. As a result, the motor generator 3 is driven to generate a predetermined torque. During regenerative braking of the vehicle, the inverter 5 converts the three-phase AC voltage, which is generated by the motor generator 3 under rotational force from wheels, into a DC voltage according to switching control by the control circuit, and outputs the DC voltage to the P line 8. In this way, the inverter 5 performs bidirectional power conversion between the DC power supply 2 and the motor generator 3.

The inverter 5 includes upper-and-lower arm circuits 10 for three phases. The upper-and-lower arm circuit 10 is sometimes referred to as a leg. Each upper-and-lower arm circuit 10 has an upper arm 10H and a lower arm 10L. The upper arm 10H and the lower arm 10L are connected in series between the P line 8 and the N line 9, with the upper arm 10H on the P line 8 side.

The connecting point between the upper arm 10H and the lower arm 10L, i.e., the midpoint of the upper-and-lower arm circuit 10, is connected to a winding 3*a* of a corresponding phase of the motor generator 3 via an output line 11. In the upper-and-lower arm circuit 10, the U-phase upper-and-lower arm circuit 10U is connected to the U-phase winding 3*a* via the output line 11. The V-phase upper-and-lower arm circuit 10V is connected to the V-phase winding 3*a* via the output line 11. The W-phase upper-and-lower arm circuit 10W is connected to the W-phase winding 3*a* via the output line 11.

The upper-and-lower arm circuit 10 (10U, 10V and 10W) has a series circuit 12. The upper-and-lower arm circuit 10 may have one or more series circuit(s) 12. In the case of two or more series circuits 12, the series circuits 12 are connected in parallel to each other to form an upper-and-lower arm circuit 10 for one phase. In this embodiment, each upper-and-lower arm circuit 10 has one series circuit 12. The series circuit 12 is formed by connecting a switching element on the upper arm 10H side and a switching element on the lower arm 10L side in series between the P line 8 and the N line 9.

The number of the high-side switching elements and the number of the low-side switching elements configuring the series circuit 12 are each not limited. The number may be one or more. The series circuit 12 in this embodiment has two switching elements on the high side and two switching elements on the low side. The two switching elements on the high side are connected in parallel, and the two switching elements on the low side are connected in parallel, so that one series circuit 12 is formed. In other words, the six arms 10H and 10L of the upper-and-lower arm circuits 10 for the three phases are each formed of two switching elements connected in parallel to each other.

In this embodiment, an n-channel MOSFET 13 is used as each switching element. MOSFET is an abbreviation for Metal Oxide Semiconductor Field Effect Transistor. The two high-side MOSFETs 13 connected in parallel are on-driven or off-driven at the same timing by a common gate drive signal (drive voltage). The two low-side MOSFETs 13 connected in parallel are on-driven or off-driven at the same timing by a common gate drive signal (drive voltage).

A freewheeling diode 14 (hereinafter referred to as FWD 14) is connected in antiparallel to each of the MOSFETs 13. In the case of the MOSFET 13, the FWD 14 may be a parasitic diode (body diode) or an external diode. In the upper arm 10H, the drain of the MOSFET 13 is connected to the P line 8. In the lower arm 10L, the source of the MOSFET 13 is connected to the N line 9. The drain of the MOSFET 13 in the upper arm 10H and the drain of the MOSFET 13 in the lower arm 10L are connected to each other. The anode of the FWD 14 is connected to the source of the corresponding MOSFET 13, and the cathode thereof is connected to the drain of that MOSFET 13.

The switching element is not limited to the MOSFET 13. For example, IGBT may be used. IGBT is an abbreviation for Insulated Gate Bipolar Transistor. For the IGBT, the FWD14 is also connected in antiparallel.

The drive circuit 7 drives the switching elements configuring the power conversion circuit such as the inverter 5. The drive circuit 7 supplies a drive voltage to the gate of a corresponding MOSFET 13 based on a drive command from the control circuit. By applying the drive voltage, the drive circuit drives, i.e., on-drives or off-drives the corresponding MOSFET 13. The drive circuit is sometimes referred to as a driver.

The power conversion device 4 may include the control circuit of the switching element. The control circuit generates the drive command for operating the MOSFET 13 and outputs the drive command to the drive circuit 7. The control circuit generates the drive command based on, for example, a torque request received from an undepicted host ECU or each of signals detected by various sensors. ECU is an abbreviation for Electronic Control Unit. The control circuit may be provided within the host ECU.

Examples of the sensors include a current sensor, a rotation angle sensor, and a voltage sensor. The power conversion device 4 may include at least one of the sensors. The current sensor detects a phase current flowing through the winding 3*a* of each phase. The rotation angle sensor detects a rotation angle of a rotor of the motor generator 3. The voltage sensor detects a voltage across the smoothing capacitor 6. The control circuit includes, for example, a processor and a memory. The control circuit outputs, for example, a PWM signal as the drive command. PWM is an abbreviation for Pulse Width Modulation.

The power conversion device 4 may include a converter as the power conversion circuit. The converter is a DC-DC conversion circuit that converts a DC voltage to a DC voltage having a different value. The converter is provided between the DC power supply 2 and the smoothing capacitor 6. The converter includes, for example, a reactor and the aforementioned upper-and-lower arm circuit 10. This configuration enables stepping up and stepping down of the voltage. The power conversion device 4 may include a filter capacitor that removes power-supply noise from the DC power supply 2. The filter capacitor is provided between the DC power supply 2 and the converter.

Figure 2:
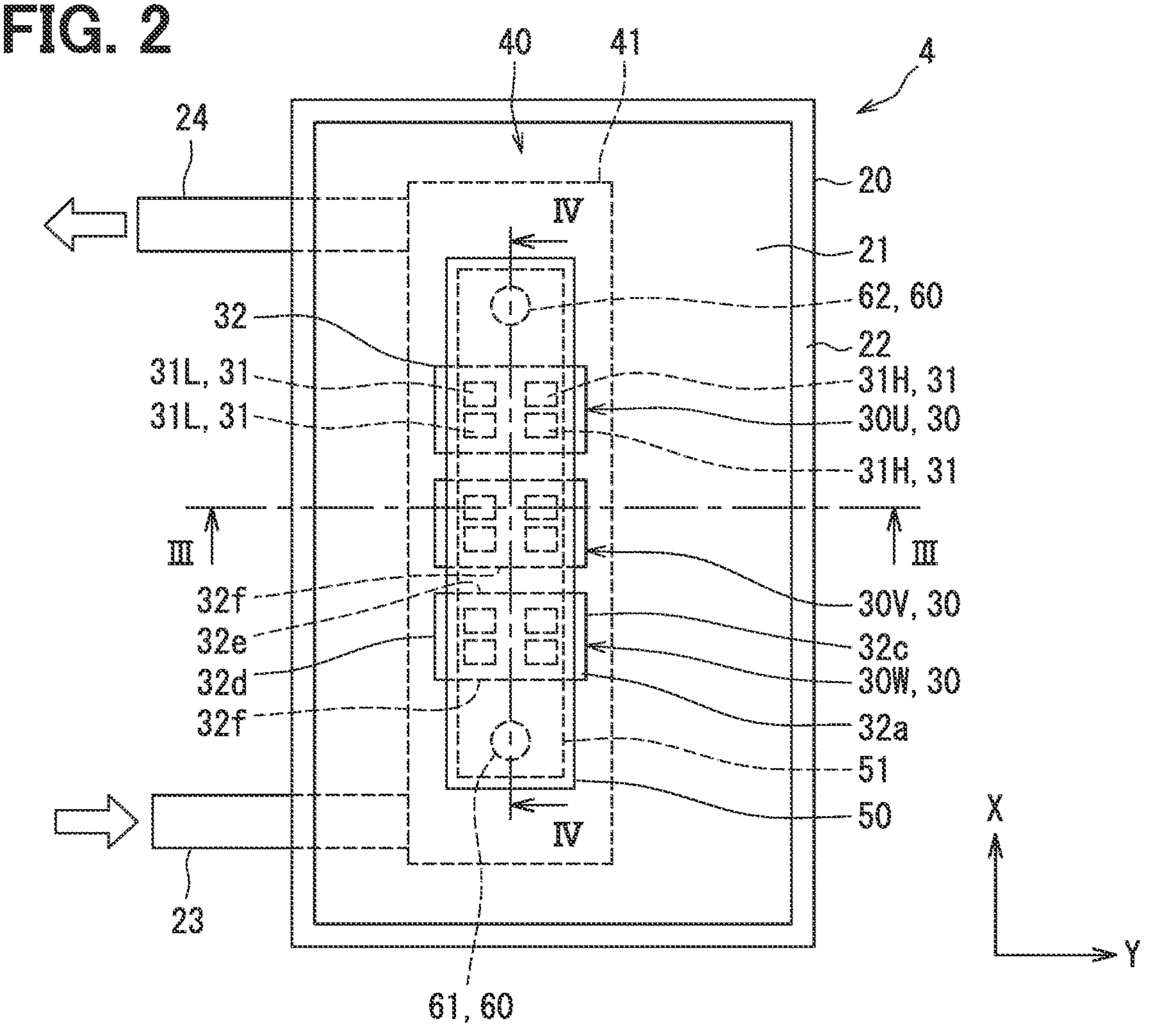
FIG. 2 is a planar view illustrating the power conversion device.
Figure 3:
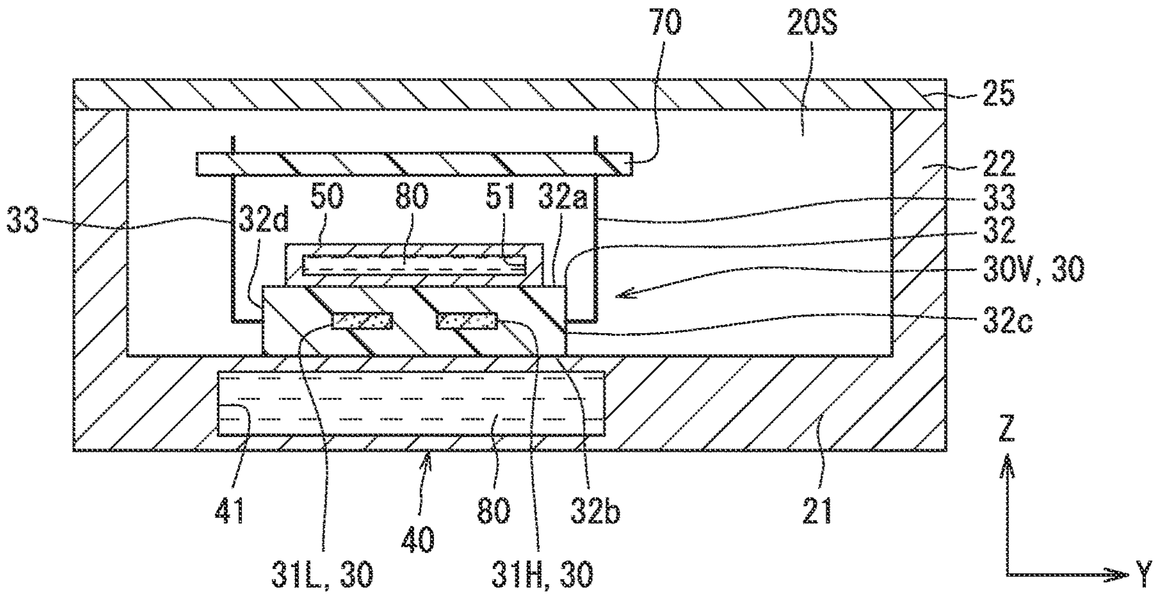
FIG. 3 is a cross sectional diagram taken along the line III-III in FIG. 2.
Figure 4:
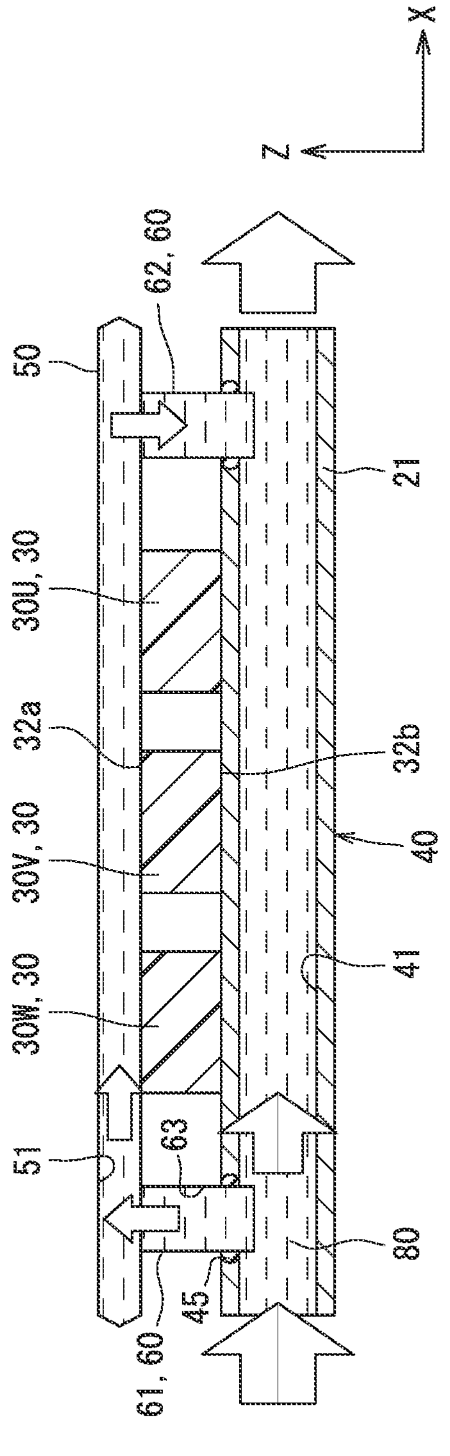
FIG. 4 is a cross sectional diagram taken along the line IV-IV in FIG. 2.

FIG. 2 is a plan view illustrating the power conversion device 4 of this embodiment. In FIG. 2, some elements such as a cover and a circuit board are omitted so as to see arrangement of the semiconductor modules and coolers. FIG. 3 is a cross sectional diagram along the line III-III in FIG. 2. FIG. 4 is a cross sectional diagram along the line IV-IV in FIG. 3. In FIG. 4, the cover and the circuit board are also omitted. The white arrows in FIGS. 2 and 4 indicate a flow direction of the refrigerant.

The power conversion device 4 of this embodiment includes a case 20, a semiconductor module 30, a first cooler 40, a second cooler 50, and a coupling pipe 60. The power conversion device 4 may include a circuit board 70 as shown in FIG. 3.

Hereinafter, the arrangement direction of the semiconductor modules 30 is referred to as an X direction. A direction, perpendicular to the X direction and along which the semiconductor module 30, the first cooler 40, and the second cooler 50 are stacked, is referred to as a Z direction. The direction perpendicular to both the X direction and the Z direction is referred to as a Y direction. The X direction, Y direction, and Z direction are in a positional relationship where they are perpendicular to each other. Planar view from the Z direction may be simply referred to as planar view.

The case 20 houses other elements configuring the power conversion device 4. The case 20 includes, for example, a compact formed by aluminum die-casting. The case 20 has an opening to house other elements. The case 20 has a first wall part and a second wall part that is continuous with the first wall part and defines a housing space 20S together with the first wall part. For example, in a box-shaped case 20 with one side open, the bottom wall may be the first wall part, and the side wall may be the second wall part. The cylindrical side wall may be the second wall part, and a partition wall that partitions the cylinder interior space may be the first wall part.

The case 20 of this embodiment has a box shape with one side open. The case 20 has a substantially rectangular shape in planar view in the Z direction. The case 20 has a bottom wall 21 and side walls 22. In the housing space 20S of the case 20, the semiconductor modules 30, the second cooler 50, the circuit board 70, and the like are disposed.

An introduction pipe 23 for supplying a refrigerant to the first cooler 40 and the second cooler 50, and a discharge pipe 24 for discharging the refrigerant from the first cooler 40 and the second cooler 50 are installed through the side wall 22. The introduction pipe 23 and the discharge pipe 24 are inserted through corresponding through holes (not shown) so as to be located inside and outside the case 20. The introduction pipe 23 and the discharge pipe 24 each include a portion extending in the Y direction. The introduction pipe 23 and the discharge pipe 24 are installed through a common side wall 22, for example.

As shown in FIG. 3, the power conversion device 4 may include a cover 25 (lid) to close an opening of the case 20. The case 20 and the cover 25 are sometimes referred to as a housing.

The semiconductor module 30 configures the aforementioned upper-and-lower arm circuit 10, i.e., the inverter 5 (power conversion circuit). The power conversion device 4 of this embodiment includes three semiconductor modules 30. One semiconductor module 30 provides one series circuit 12, i.e., the upper-and-lower arm circuit 10 for one phase. The plurality of semiconductor modules 30 include a semiconductor module 30U forming an upper-and-lower arm circuit 10U, a semiconductor module 30V forming an upper-and-lower arm circuit 10V, and a semiconductor module 30W forming an upper-and-lower arm circuit 10W.

All the semiconductor modules 30 have a common structure. Each semiconductor module 30 includes a semiconductor element 31, a sealing body 32, a signal terminal 33, and the like. The semiconductor element 31 includes a switching element formed on a semiconductor substrate made of silicon (Si), a wide bandgap semiconductor having a wider bandgap than silicon, or the like. The switching element has a vertical structure such that main current flows in a thickness direction of the semiconductor substrate. Examples of the wide bandgap semiconductor include silicon carbide (SiC), gallium nitride (GaN), gallium oxide ($Ga_2O_3$), and diamond. The semiconductor element 31 is sometimes referred to as a power element, a semiconductor chip and the like.

The semiconductor element 31 of this embodiment includes the aforementioned n-channel MOSFET 13 and the FWD 14 formed on the semiconductor substrate made of SiC. The MOSFET 13 has a vertical structure such that the main current flows in the thickness direction of the semiconductor element 31 (semiconductor substrate). The semiconductor element 31 has undepicted main electrodes on the two sides in the thickness direction thereof. Specifically, the semiconductor element 31 has a source electrode on its surface and a drain electrode on its back, as the main electrodes of the switching element. The source electrode is formed on a portion of the front surface. The drain electrode is formed on almost the entire back.

The main current flows between the drain electrode and the source electrode. The semiconductor element 31 has an undepicted pad as a signal electrode on the forming surface of the source electrode. The semiconductor element 31 is disposed such that its thickness direction is substantially parallel to the Z direction. The semiconductor elements 31 of this embodiment include two semiconductor elements 31H that provide switching elements on the high side of the series circuit 12 and two semiconductor elements 31L that provide switching elements on the low side of the series circuit 12. The semiconductor elements 31H and 31L are arranged side by side in the Y direction. The two semiconductor elements 31H are arranged side by side in the X direction. Similarly, the two semiconductor elements 31L are arranged side by side in the X direction.

The four semiconductor elements 31 provide four switching elements of one series circuit 12. The semiconductor module 30 includes the semiconductor elements 31 in the number corresponding to the number of switching elements configuring one series circuit 12. In the case of the two switching elements configuring the series circuit 12, the semiconductor module 30 includes one each of the semiconductor elements 31H and 31L.

The sealing body 32 seals some of other elements configuring the semiconductor module 30. The rest of other elements are exposed outside of the sealing body 32. The sealing body 32 is made of resin, for example. The sealing body 32 is molded by a transfer mold method, using, for example, epoxy resin as a material. The sealing body 32 may be formed of gel, for example.

The sealing body 32 has, for example, a substantially rectangular shape in planar view. The sealing body 32 has one side 32*a* and a back 32*b* opposite to the side 32*a* in the Z direction, as surfaces forming its outline. The side 32*a* and the back 32*b* are each a flat surface, for example. The sealing body 32 further has side surfaces 32*c*, 32*d*, 32*e*, and 32*f* that connect the side 32*a* and the back 32*b*. The side surface 32*c* is opposite to the side surface 32*d* in the Y direction. The side surface 32*e* is opposite to the side surface 32*f* in the X direction.

The signal terminal 33 is an external connection terminal electrically connected to the pad of the semiconductor element 31. The signal terminal 33 protrudes from the sealing body 32 to the outside. For example, the signal terminal 33 connected to the pad of the semiconductor element 31H protrudes from the side surface 32*c* of the sealing body 32. The signal terminal 33 connected to the pad of the semiconductor element 31L protrudes from the side surface 32*d* of the sealing body 32.

In addition to such elements, the semiconductor module 30 includes main terminals and wiring components (not shown). The main terminals are each an external connection terminal electrically connected to the main electrode of the semiconductor element 31. The main terminals include a P terminal, an N terminal, and an output terminal. The P terminal is electrically connected to the drain electrode of the semiconductor element 31H. The N terminal is electrically connected to the source electrode of the semiconductor element 31L. The P terminal and the N terminal are sometimes referred to as a power terminal. The output terminal is electrically connected to a connection point between the source electrode of the semiconductor element 31H and the drain electrode of the semiconductor element 31L, i.e., the connection point (midpoint) of the series circuit 12. For example, the P terminal and the N terminal protrude to the outside from the side surface 32*c* of the sealing body 32, and the output terminal protrudes to the outside from the side surface 32*d* of the sealing body 32. In other words, the external connection terminals do not protrude from the side surfaces 32*e* and 32*f*.

The wiring components provide a wiring function to electrically connect the main electrodes and the main terminals of the semiconductor element 31. The wiring components provide a heat dissipation function to dissipate heat from the semiconductor element 31. The wiring components are disposed so as to sandwich the semiconductor element 31 in the Z direction, for example. The wiring components may each include a substrate including metal bodies disposed on respective two sides of an insulating substrate, or a heat sink being a metal component. The heat sink is provided as part of a lead frame, for example. Heat dissipation can be increased by exposing part of the wiring component from the one side 32*a* and/or the back 32*b* of the sealing body 32.

The semiconductor module 30 is disposed over the bottom wall 21 such that the back 32*b* faces the inner surface of the bottom wall 21. An electrically insulating component such as a ceramic plate is disposed between the semiconductor module 30 and the bottom wall 21 of the case 20 as required. As illustrated in FIG. 2, the three semiconductor modules 30 are arranged in the X direction. In other words, the plurality of semiconductor modules 30 are horizontally arranged along the X direction. The three semiconductor modules 30 are arranged in the order of, for example, the semiconductor module 30U, the semiconductor module 30V, and the semiconductor module 30W.

In the X direction, the side surfaces of adjacent semiconductor modules 30 face each other with a predetermined space therebetween. Specifically, a side surface 32*f* of the semiconductor module 30U faces a side surface 32*e* of the semiconductor module 30V, and a side surface 32*f* of the semiconductor module 30V faces a side surface 32*e* of the semiconductor module 30W.

The first cooler 40 is configured using the first wall part, on which the semiconductor modules 30 are disposed, of the case 20. As illustrated in FIGS. 2 to 4, the first cooler 40 includes a bottom wall 21 being the first wall part, and a flow path 41 formed within the bottom wall 21 and through which a refrigerant 80 flows. The first cooler 40 cools the semiconductor modules 30 from a back 32*b* side. The flow path 41 corresponds to the first flow path.

The flow path 41 is provided so as to overlap at least part of each semiconductor module 30 in planar view to effectively cool the semiconductor modules 30. The flow path 41 of this embodiment is provided so as to enclose the greater part of each semiconductor module 30 in planar view. The flow path 41 extends along the arrangement direction of the three semiconductor modules 30, i.e., along the X direction. The flow path 41 is extended in the X direction.

The refrigerant 80 is supplied into the flow path 41 via the introduction pipe 23. The refrigerant 80 that has flowed through the flow path 41 is discharged to the outside of the power conversion device 4 via the discharge pipe 24. A phase-change refrigerant such as water or ammonia or a non-phase-change refrigerant such as an ethylene glycol-based refrigerant can be used as the refrigerant 80.

The second cooler 50 is provided without using the case 20. The second cooler 50 is disposed in a housing space 20S of the case 20. The second cooler 50 is disposed on the one side 32*a* of the semiconductor module 30 in the housing space 20S. An electrically insulating component such as a ceramic plate is disposed between the second cooler 50 and the semiconductor module 30 as required. The second cooler 50 cools the semiconductor module 30 from the side opposite to the first cooler 40 in the Z direction. The second cooler 50 has therein the flow path 51 through which the refrigerant 80 flows. The refrigerant 80 is supplied into the flow path 51 via the introduction pipe 23. The refrigerant 80 that has flowed through the flow path 51 is discharged to the outside of the power conversion device 4 via the discharge pipe 24. The flow path 51 corresponds to the second flow path.

In the Z direction, the second cooler 50 is thinner than the first cooler 40, i.e., than the bottom wall 21. The second cooler 50 as a whole is in a form of a flat tubular body, for example. The second cooler 50 is configured to have a flow path therein using a pair of plates (thin metal plates), for example. At least one of the pair of plates is pressed into a shape bulging in the Z direction. After that, the outer peripheral edges of the pair of plates are fixed together by caulking or the like and joined together along the entire circumference by brazing or the like. As a result, the flow path 51 is formed between the pair of plates such that the refrigerant 80 can flow therethrough. Rigidity of the second cooler 50 configured in this way is lower than that of the first cooler 40.

The flow path 51 is provided so as to overlap at least a portion of each semiconductor module 30 in planar view to effectively cool the semiconductor module 30. The flow path 51 of this embodiment is provided so as to overlap a greater part of each semiconductor module 30 in planar view. The flow path 51 extends along the arrangement direction of the three semiconductor modules 30, i.e., along the X direction. The flow path 51 is extended in the X direction. The flow path 51 crosses the three semiconductor modules 30 in the X direction. In planar view, the flow path 51 is enclosed in the flow path 41. The extending length of the flow path 51 is shorter than that of the flow path 41.

The second cooler 50 is stacked on the first cooler 40 with the semiconductor modules 30 in between. The second cooler 50 may be pressed in the Z direction from the surface opposite to the semiconductor module 30 by an undepicted pressure component. Such pressing allows the second cooler 50 and the semiconductor module 30 as well as the semiconductor module 30 and the first cooler 40 to be held with good heat conduction. The pressure component includes, for example, a pressure plate and an elastic component. The elastic component includes a material that generates a pressing force by elastic deformation, for example, rubber, or a metal spring. The elastic component is disposed between the pressure plate and the second cooler 50 in the Z direction. The pressure plate is fixed at a predetermined position with respect to the case 20 to allow elastic deformation of the elastic component. The second cooler 50 and the semiconductor modules 30 are pressed against the first cooler 40 (bottom wall 21) by reaction force of the elastic deformation.

The coupling pipe 60 couples the first cooler 40 with the second cooler 50. The coupling pipe 60 includes a coupling pipe 61 for supplying the refrigerant 80 into the flow path with which the introduction pipe 23 is not coupled, and a coupling pipe 62 for discharging the refrigerant 80 from the flow path with which the discharge pipe 24 is not coupled. Each coupling pipe of the coupling pipe 60 has a coupling flow path 63 to communicate with the flow paths 41 and 51. The coupling flow path 63 extends in the Z direction. One end of the coupling flow path 63 communicates with the flow path 41, and the other end communicates with the flow path 51. The coupling pipe 60 corresponds to the coupling part.

The coupling pipe 61 (coupling flow path 63) is coupled with the vicinity of one end in the X direction of the second cooler 50 (flow path 51). The coupling pipe 62 (coupling flow path 63) is coupled with the vicinity of other end of the second cooler 50 (flow path 51). The sign 45 shown in FIG. 4 refers to a seal part around the coupling pipe 60 provided in the first cooler 40. The seal part 45 is provided using a grommet, for example.

In this embodiment, the introduction pipe 23 is coupled with the vicinity of one end in the X direction of the flow path 41, and the discharge pipe 24 is coupled with the vicinity of the other end thereof. In the X direction, the coupling pipe 60 is disposed between the coupling position of the introduction pipe 23 with the first cooler 40 and the coupling position of the discharge pipe 24 with the first cooler 40.

Part of the refrigerant 80 supplied from the introduction pipe 23 flows through the flow path 41 and is discharged from the discharge pipe 24. Another part of the refrigerant 80 is supplied into the flow path 51 through the flow path 41 and the coupling flow path 63 of the coupling pipe 61. The refrigerant 80 that has flowed through the flow path 51 flows into the flow path 41 through the coupling flow path 63 of the coupling pipe 62, and is discharged from the discharge pipe 24.

Flow rate of the refrigerant 80 flowing through the flow path 41 is larger than flow rate of the refrigerant 80 flowing through the flow path 51. The flow path 41 is the main flow path, and the flow path 51 is a subsidiary flow path branched from the flow path 41. The flow rate of the flow path 41 that has passed through the branch portion formed by the coupling pipe 61 is larger than the flow rate of the refrigerant 80 flowing through the flow path 51. The cross-sectional area of the flow path 41 is larger than that of the flow path 51. In the Z direction, thickness (height) of the first cooler 40 is larger than that of the second cooler 50.

The flow path 51, or the subsidiary flow path, is branched from the flow path 41 being the main flow path via the coupling flow path 63. The cross-sectional area of the coupling flow path 63 is smaller than that of the flow path 41. The cross-sectional area of each flow path corresponds to area of a cross section perpendicular to the extending direction of the flow path, i.e., the flow direction of the refrigerant. Water flow resistance of the coupling flow path 63 is smaller than that of the flow path 51.

As described above, the power conversion device 4 of this embodiment makes it possible to cool the semiconductor module 30 from both sides in the Z direction by the first cooler 40 and the second cooler 50.

In a configuration with a two-stage cooler, the cooler is probably made thinner in the Z direction to reduce size in the Z direction, i.e., to reduce height. However, this makes the flow path to be narrower, leading to an increase in pressure loss. In this embodiment, in the configuration with a two-stage cooler, flow rate of the refrigerant 80 is made different between the flow paths 41 and 51, and the cross-sectional area of the flow path 41 with a larger flow rate is made larger than that of the flow path 51 with a smaller flow rate. In other words, the flow path 51 with a smaller flow rate is made narrower, and the flow path 41 with the larger flow rate is made wider. The first cooler 40 with the wider flow path 41 is configured using part of the case 20 that houses the semiconductor modules 30. The second cooler 50 with the narrower flow path 51 is housed in the case 20 together with the semiconductor modules 30. As a result, it is possible to reduce height of the power conversion device 4 while suppressing an increase in pressure loss.

Size of the cross-sectional area of the coupling flow path 63 is not limited. In the configuration of this embodiment, the coupling flow path 63 connects the flow path 41 being the main flow path and the flow path 51 being the subsidiary flow path, which makes it possible to make the cross-sectional area of the coupling flow path 63 to be small compared with a configuration where the flow path 51 is the main flow path. For example, the cross-sectional area of the coupling flow path 63 is made smaller than that of the flow path 41. As a result, size of the power conversion device 4 can be reduced in the X direction perpendicular to the Z direction. In particular, in this embodiment, water flow resistance of the coupling flow path 63 is smaller than that of the flow path 51. As a result, even if the coupling flow path 63 is narrowed in the X direction, the refrigerant 80 can be stably supplied from the flow path 41 being the main flow path into the flow path 51 being the subsidiary flow path.

Figure 5:
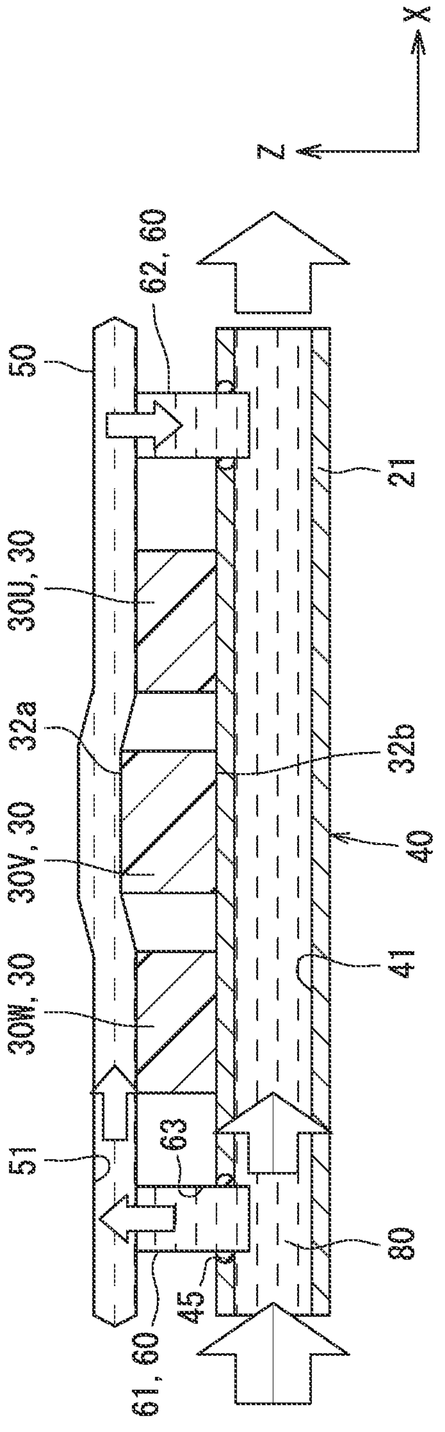
FIG. 5 illustrates an effect of a second cooler.

The rigidity of the second cooler 50 may be higher than or roughly equal to that of the first cooler 40. In this embodiment, rigidity of the second cooler 50 is lower than that of the first cooler 40. As a result, as illustrated in FIG. 5, even if variation occurs in height or assembling in the Z direction of the semiconductor module 30, such variation can be absorbed by deformation of the second cooler 50. Even if height variation occurs, since the second cooler 50 is in close contact with the plurality of semiconductor modules 30, the semiconductor modules 30 can be cooled from both sides. FIG. 5 is a cross sectional diagram illustrating the effect of the second cooler 50. FIG. 5 corresponds to FIG. 4.

The arrangement order of the three semiconductor modules 30U, 30V, and 30W is not limited to the above example. The semiconductor module 30U or 30W may be disposed in the middle.

Figure 6:
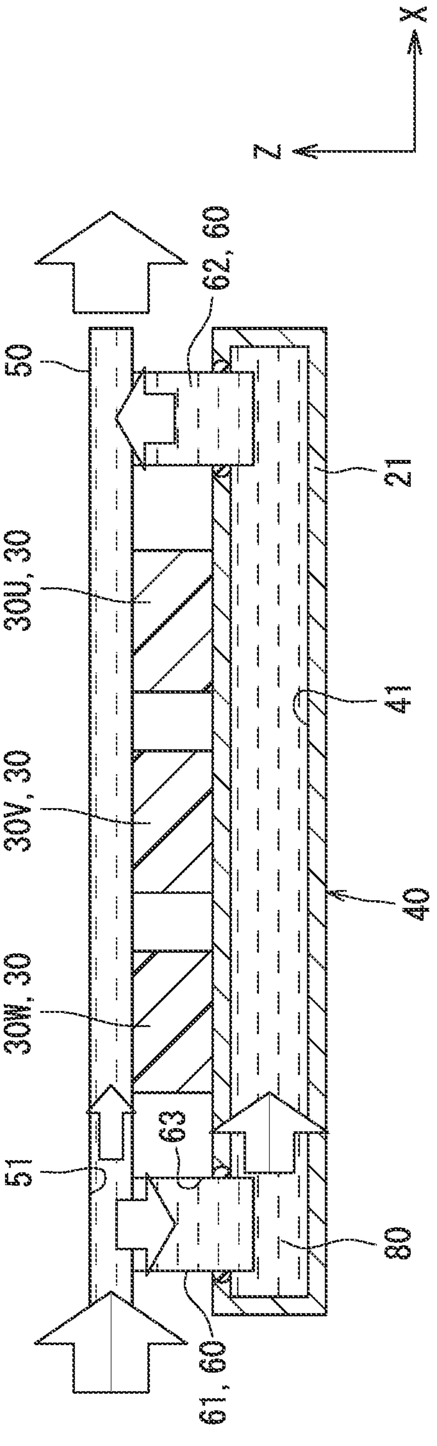
FIG. 6 is a cross sectional diagram illustrating a modification.

An example, where the introduction pipe 23 and the discharge pipe 24 are connected to the first cooler 40, has been non-exclusively given. The introduction pipe 23 and discharge pipe 24 may be connected to the second cooler 50. In such a case, as illustrated in FIG. 6, the refrigerant 80 is supplied into the flow path 51 of the second cooler 50. Part of the refrigerant 80 flows from the flow path 51 to the flow path 41 of the first cooler 40 via the coupling pipe 61. The refrigerant 80 that has flowed through the flow path 41 returns to the flow path 51 via the coupling pipe 62 and is discharged. In such a configuration, the cross-sectional area of the flow path 41 with a larger flow rate is made larger than that of the flow path 51 with a smaller flow rate. A first cooler 40 is configured using part of the case 20. Consequently, height of the power conversion device 4 can be reduced while suppressing an increase in pressure loss. FIG. 6 illustrates the modification. FIG. 6 corresponds to FIG. 4.

Second Embodiment

A second embodiment is a modification based on the preceding embodiment, where description of the preceding embodiment can be used as reference.

Figure 7:
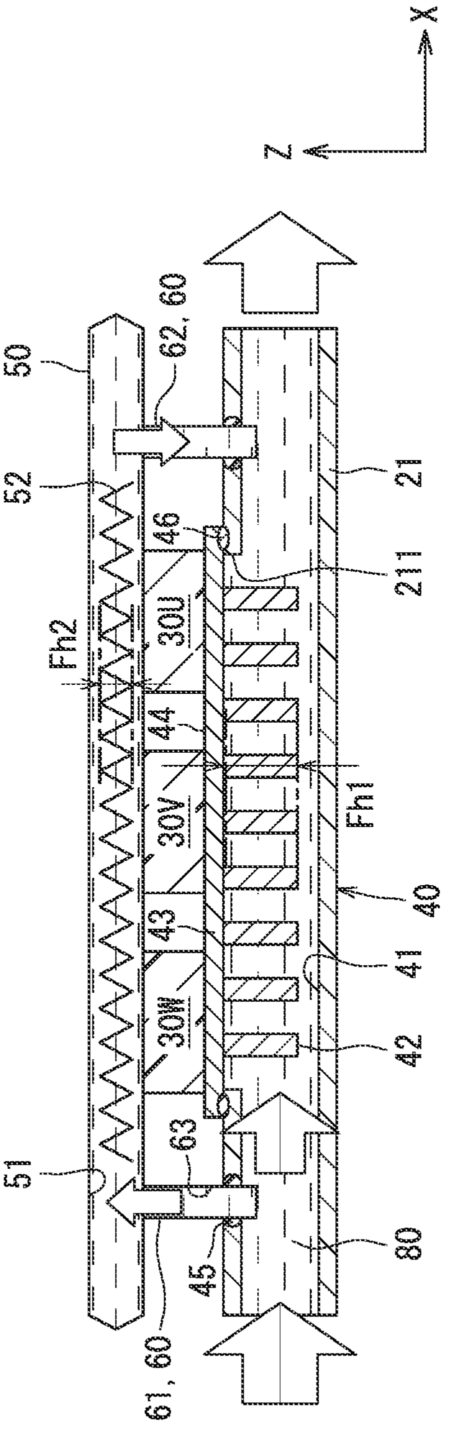
FIG. 7 is a cross sectional diagram illustrating the power conversion device according to a second embodiment.
Figure 8:
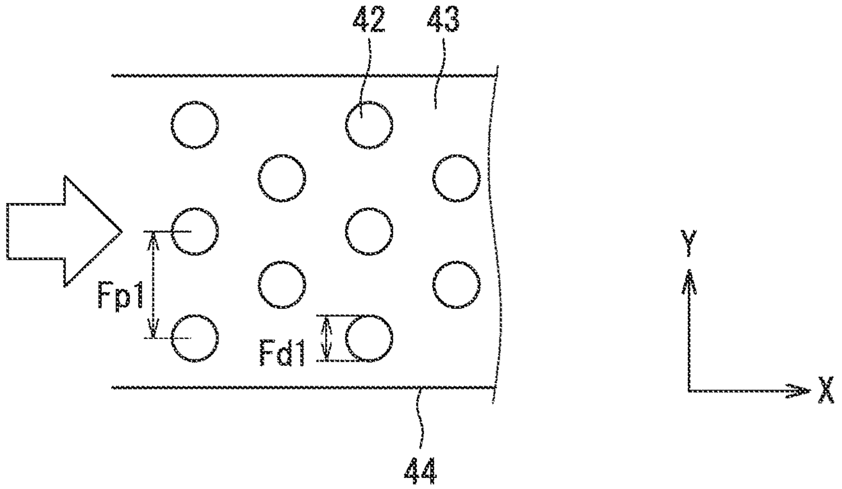
FIG. 8 illustrates arrangement of fins in a first cooler.

FIG. 7 is a cross sectional diagram illustrating a power conversion device 4 of this embodiment. FIG. 7 corresponds to FIG. 4. FIG. 8 is a plan view illustrating the heat radiating component. The white arrows in FIGS. 7 and 8 indicate a flow direction of the refrigerant. In this embodiment, fins are added to the cooler with respect to the configuration described in the preceding embodiment. The first cooler 40 includes fins 42 disposed in the flow path 41. The second cooler 50 includes fins 52 disposed in the flow path 51. The fins 42 correspond to the first fin, and the fins 52 correspond to the second fin.

As illustrated in FIG. 7, the fins 42 protrude from a base 43. A heat radiating component 44 has a base 43 and the fins 42. The heat radiating component 44 is disposed so as to overlap the semiconductor modules 30 in planar view. The base 43 is disposed so as to close an opening 211, which communicates with the housing space 20S and the flow path 41, of the bottom wall 21. The peripheral edge of the base 43 is liquid-tightly joined to an opening edge of the bottom wall 21 by friction stir welding or the like. This makes it possible to suppress the refrigerant 80 from leaking to the outside of the flow path 41 through the opening 211. The base 43 defines the flow path 41 together with the bottom wall 21. A seal part 46, which is a joint between the base 43 and the bottom wall 21, provides a liquid-tight seal. In the extending direction of the first cooler 40, the seal part 46 is located inside the seal part 45.

The fins 42 are disposed in the flow path 41 through the opening 211. The fins 42 protrude from one side of the base 43. The fins 42 extend in the Z direction. The fins 42 are each a pin-shaped fin, for example. The fin 42 has a roughly circular shape, a roughly elliptical shape, or the like in planar view. The fin 42 has a predetermined height Fh1 in the Z direction. As illustrated in FIG. 8, the fins 42 are provided with a predetermined pitch Fp1 in the Y direction. Each fin 42 has a diameter of Fd1.

The fins 52 are disposed in the flow path 51 formed by a pair of plates (metal thin plates). The fins 52 are disposed so as to overlap the semiconductor modules 30 in planar view. The fin 52 is a wave-type fin, for example. The fin 52 has a predetermined height Fh2 in the Z direction. The fin 52 has height Fh2 lower than the height Fh1 of the fin 42. Although not shown, the fins 52 are provided with a predetermined pitch Fp2 in the Y direction. The pitch Fp2 of the fins 52 is smaller than the pitch Fp1 of the fins 42.

The cross-sectional area of the coupling flow path 63 of this embodiment is narrower than the cross-sectional area of the coupling flow path 63 described in the preceding embodiment. As a result, the length of the coupling flow path 63 in the X direction is shorter than that in the preceding embodiment. Even if the cross-sectional area is further reduced, water flow resistance of the coupling flow path 63 is smaller than that of the flow path 51. Other configurations of the power conversion device 4 are the same as those described in the preceding embodiment.

According to the power conversion device 4 of this embodiment, the same effects as of the configuration described in the preceding embodiment can be exhibited. For example, in a configuration including a two-stage cooler, the flow rate of the refrigerant 80 is made different between the flow paths 41 and 51, and the cross-sectional area of the flow path 41 with a larger flow rate is made larger than the cross-sectional area of the flow path 51 with a smaller flow rate. Further, the first cooler 40 having the wider flow path 41 is configured using part of the case 20 housing the semiconductor modules 30. It is therefore possible to reduce the height of the power conversion device 4 while suppressing an increase in pressure loss.

Furthermore, in this embodiment, the first cooler 40 includes the fins 42 and the second cooler 50 includes the fins 52. As a result, in the configuration including a two-stage cooler, the semiconductor modules 30 can be cooled more effectively.

The relationship of height, a fin pitch, or the like between the fins 42 and 52 is not limited. In this embodiment, the height Fh1 of the fin 42 in the flow path 41 with a larger flow rate is set higher than the height Fh2 of the fin 52 in the flow path 51 with a smaller flow rate. This makes it possible to increase heat transfer coefficient for each of the flow paths 41 and 51. The pitch Fp2 of the fins 52 is smaller than the pitch Fp1 of the fins 42. The flow path 51 with the smaller flow rate has a smaller fin pitch. This makes it possible to increase the heat transfer coefficient while suppressing an increase in pressure loss.

In this embodiment, the seal part 45 around the coupling pipe 60 is located outside the seal part 46 of the heat radiating component 44 in the extending direction of the first cooler 40. This makes it possible to, after the heat radiating component 44 is fixed to the bottom wall 21 of the case 20, dispose the semiconductor module 30 on the heat radiating component 44, and assemble the second cooler 50 and the coupling pipe 60. In other words, it is possible to enable a cooling structure including the fins 42 and 52 while using the bottom wall 21 (first wall part) of the case 20 as the first cooler 40.

As described above, in this embodiment, the fins 52 are disposed within the flow path 51. Water flow resistance of the flow path 51 is larger than that in the configuration having no fin 52. Hence, even if cross-sectional area of the coupling flow path 63 is made smaller than that in the preceding embodiment, the refrigerant 80 can be stably supplied into the flow path 51 being the subsidiary flow path. Consequently, size of the power conversion device 4 can be further reduced in the X direction.

Third Embodiment

A third embodiment is a modification based on the preceding embodiment, where description of the preceding embodiment can be used as reference.

Figure 9:
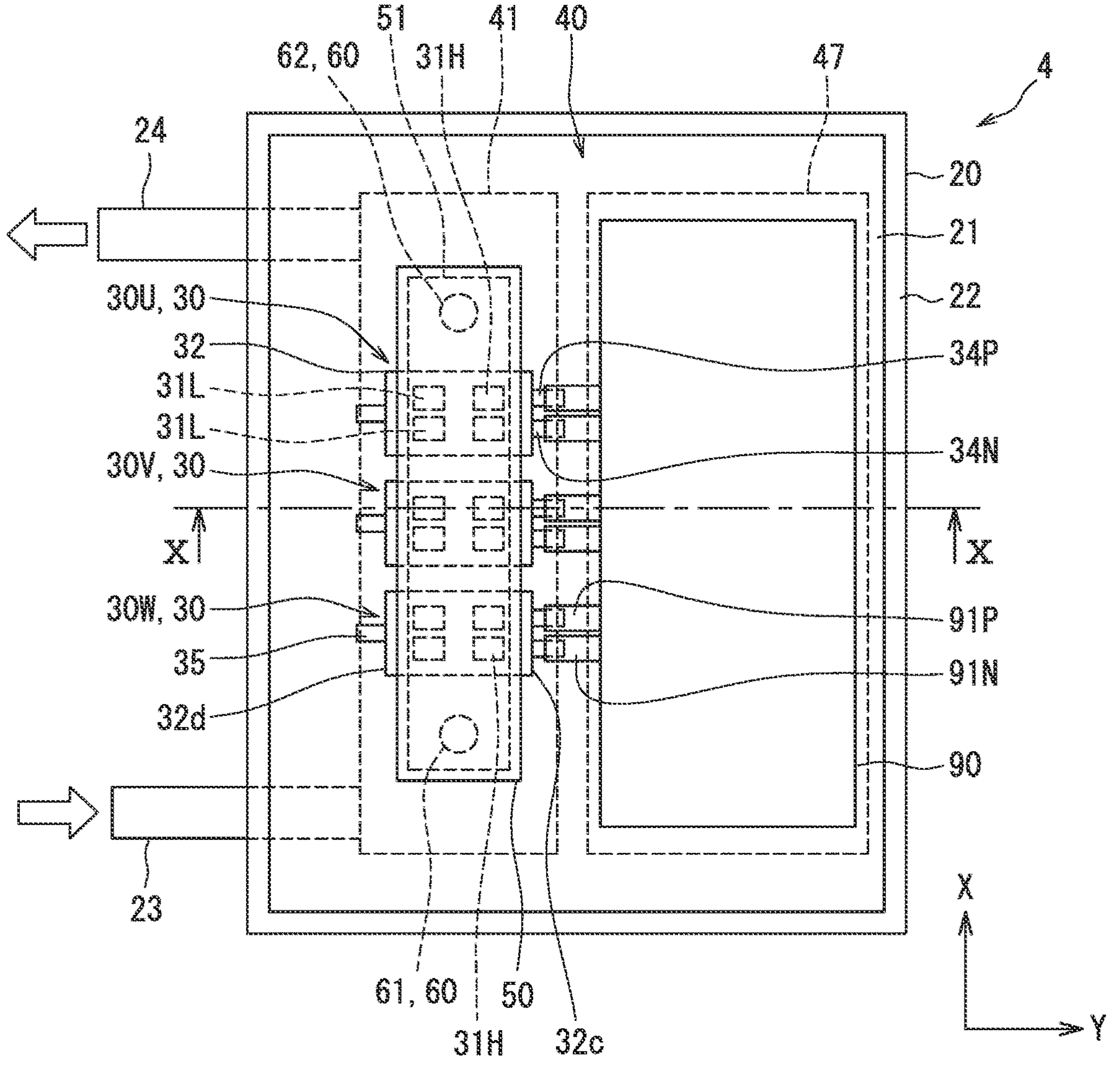
FIG. 9 is a planar view illustrating the power conversion device according to a third embodiment.
Figure 10:
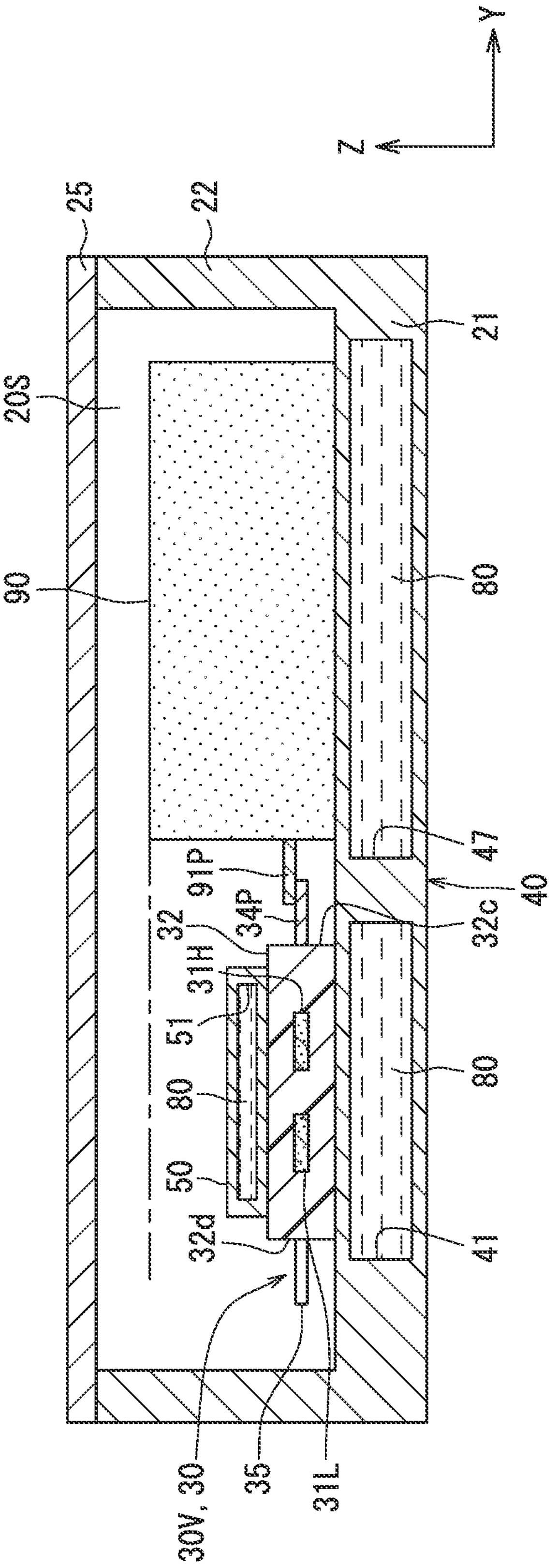
FIG. 10 is a cross sectional diagram taken along the line X-X in FIG. 9.

FIG. 9 is a plan view illustrating the power conversion device 4 of this embodiment. FIG. 9 corresponds to FIG. 2. FIG. 10 is a cross sectional diagram along the line X-X in FIG. 9. As illustrated in FIGS. 9 and 10, the semiconductor module 30 includes power terminals 34N and 34P and an output terminal 35. The power terminals 34N and 34P protrude from the side surface 32*c* of the sealing body 32, and the output terminal 35 protrudes from the side surface 32*d*.

In this embodiment, a capacitor 90 and power conductors 91N and 91P are added to the configuration described in the first embodiment. In other words, the power conversion device 4 further includes the capacitor 90 and the power conductors 91N and 91P. The configuration of this embodiment is the same as the configuration described in the first embodiment except for the capacitor 90 and the power conductors 91N and 91P.

The capacitor 90 provides the aforementioned smoothing capacitor 6. The capacitor 90 corresponds to the passive components. The capacitor 90 includes, for example, an undepicted case and a capacitor element housed in the case. In FIGS. 9 and 10, the capacitor 90 is illustrated in a simplified manner.

The capacitor 90 is disposed on the bottom wall 21 of the case 20 configuring the first cooler 40. The capacitor 90 in this embodiment is disposed on the inner surface of the bottom wall 21 in the housing space 20S of the case 20. The capacitor 90 is horizontally arranged in the Y direction with the semiconductor module 30. The capacitor 90 has a roughly rectangular shape with its longitudinal direction as the X direction in planar view. In the Z direction, the upper end of the capacitor 90 is located more away from the inner surface of the bottom wall 21 than the upper end of the second cooler 50. The upper end of the capacitor 90 is located above, i.e., at a position higher than, the upper end of the second cooler 50.

The first cooler 40 cools the capacitor 90 together with the semiconductor module 30. The first cooler 40 may have a flow path 41 provided so as to overlap the capacitor 90 in planar view to cool the capacitor 90. The first cooler 40 in this embodiment has a flow path 47, which is different from the flow path 41, within the bottom wall 21. The flow path 47 is provided so as to overlap at least part of the capacitor 90 in planar view. The flow path 47 may be provided in parallel with the flow path 41 with respect to the introduction pipe 23 and the discharge pipe 24, or may be connected to the flow path 41 via an undepicted coupling path.

The power conductors 91N and 91P are wiring components electrically connecting the capacitor 90 and the power terminals 34N and 34P, respectively, of the semiconductor module 30. The power conductors 91N and 91P are each provided, for example, as a plate-shaped metal component. The power conductors 91N and 91P are sometimes referred to as a power bus bar. The power conductors 91N and 91P are connected to the corresponding power terminals 34N and 34P by soldering, resistance welding, laser welding, or the like.

The power conductor 91N electrically connects the negative electrode of the capacitor 90 and the power terminal 34N of the semiconductor module 30. The power conductor 91N is sometimes referred to as a negative electrode conductor, a negative electrode bus bar, and an N bus bar. The power conductor 91N forms at least part of the N line 9. The power conductor 91P electrically connects the positive electrode of the capacitor 90 and the power terminal 34P of the semiconductor module 30. The power conductor 91P is sometimes referred to as a positive electrode conductor, positive electrode bus bar, and P bus bar. The power conductor 91P forms at least part of the P line 8. FIGS. 9 and 10 show terminal portions of the power conductors 91N and 91P for connection to the corresponding power terminals 34N and 34P.

According to the power conversion device 4 of this embodiment, the same effects as of the configuration described in the preceding embodiment can be exhibited.

The power conversion device 4 of this embodiment further has the capacitor 90. It is thus possible to reduce the number of components compared to a configuration with the capacitor 90 as a separate component.

In this embodiment, the first cooler 40 cools the capacitor 90. Since the capacitor 90, which generates heat when energized, is cooled, size of the capacitor 90 can be reduced. Consequently, the power conversion device 4 can be made lower in height. Furthermore, the semiconductor module 30 and the capacitor 90 are cooled by a common cooler (first cooler 40), making it possible to reduce the number of components and simplify the configuration.

A positional relationship between the upper end of the second cooler 50 and the upper end of the capacitor 90 is not limited. For example, the upper end of the second cooler 50 may be located above the upper end of the capacitor 90. In this embodiment, as in the preceding embodiment, the first cooler 40 has a higher flow rate, and the second cooler 50 has a lower flow rate. Further, a thin structure using the pair of plates (thin metal plates) is used as the second cooler 50. As a result, the upper end of the second cooler 50 is located at a position lower than the upper end of the capacitor 90. Hence, while using the two-stage cooling structure, it is possible to prevent the upper end position of the second cooler 50 from becoming a rate-determining factor in height. In other words, the height can be reduced in the configuration including the capacitor 90.

In this embodiment, the power terminals 34N and 34P, the output terminal 35, and the power conductors 91N and 91P face, in the Z direction, the bottom wall 21 forming the first cooler 40. Wiring inductance can be reduced by a magnetic-flux canceling effect caused by eddy current generated in the bottom wall 21.

The configuration described in this embodiment can be combined with any of the configurations of the first and second embodiments.

An example, where the capacitor 90 is used as the passive component, has been non-exclusively given. For example, an inductor configuring the converter may be provided as a passive component. Both the capacitor 90 and the inductor may definitely be provided as passive components.

Fourth Embodiment

A fourth embodiment is a modification based on the preceding embodiment, where description of the preceding embodiment can be used as reference.

Figure 11:
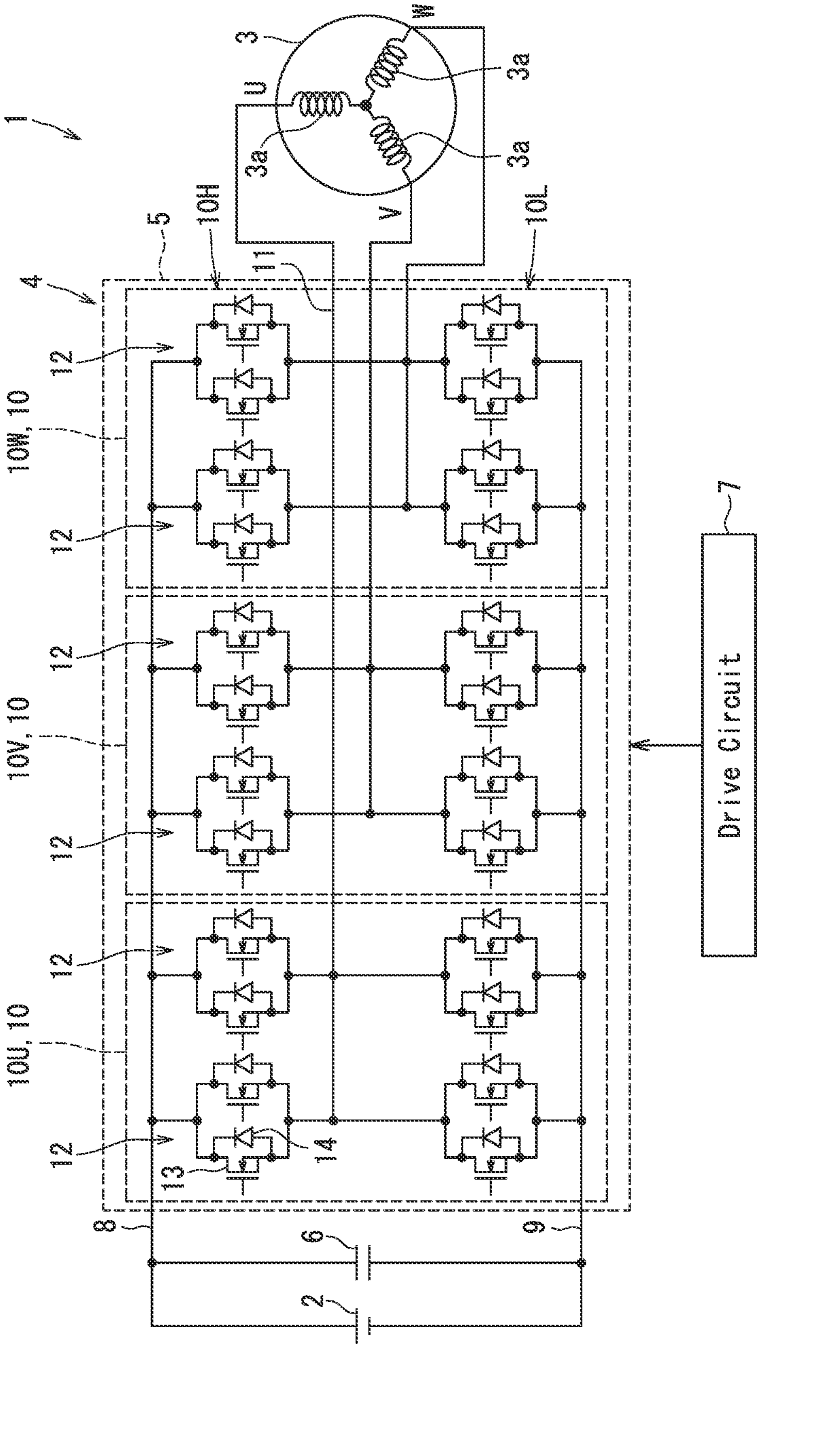
FIG. 11 illustrates a circuit configuration of the power conversion device according to a fourth embodiment.
Figure 12:
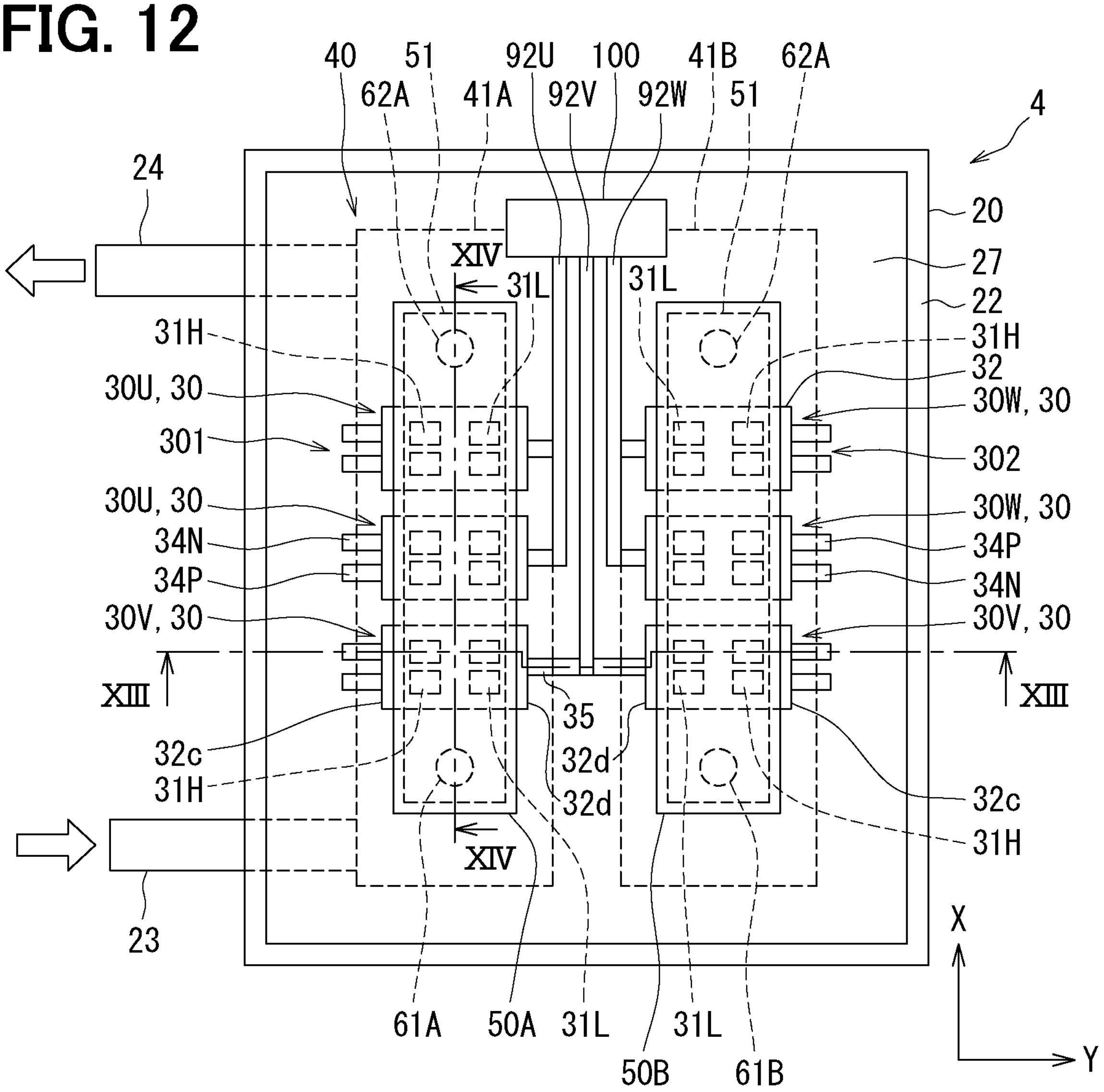
FIG. 12 is a planar view illustrating the power conversion device.
Figure 13:
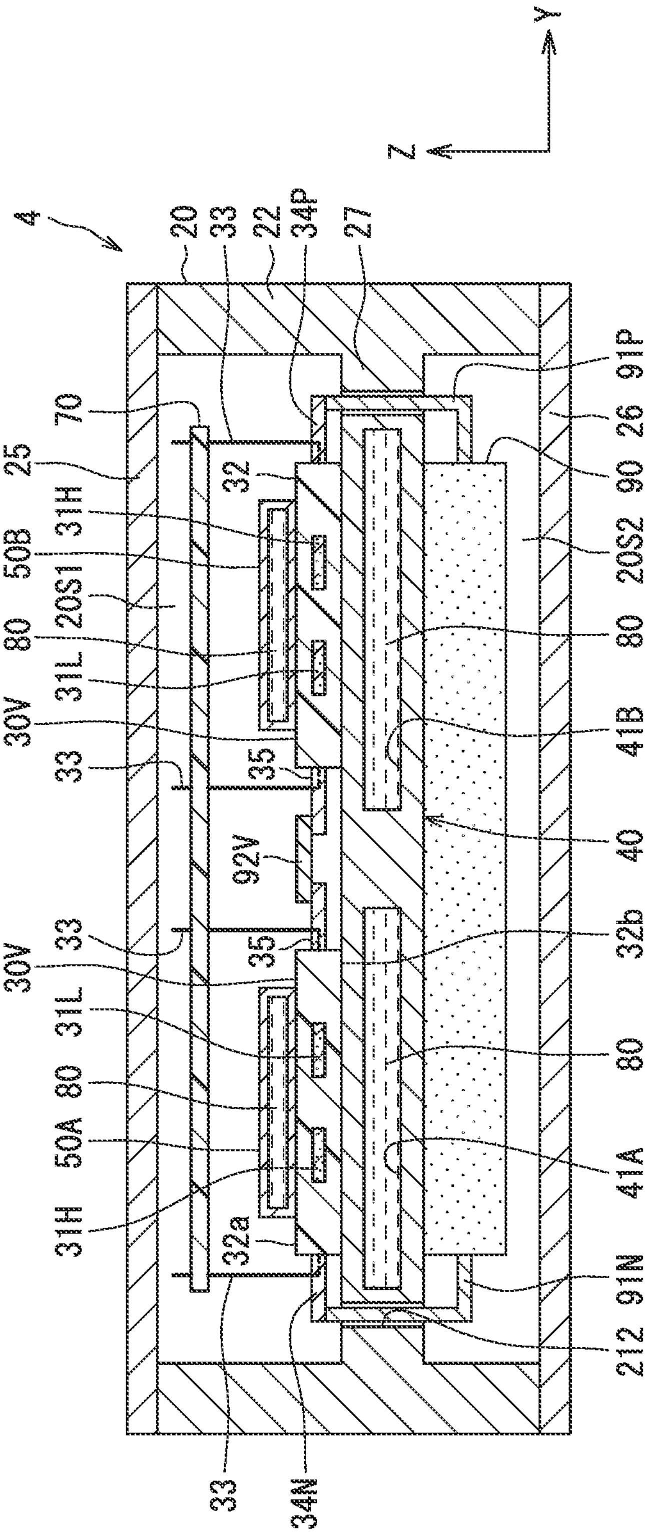
FIG. 13 is a cross sectional diagram taken along the line XIII-XIII in FIG. 12.
Figure 14:
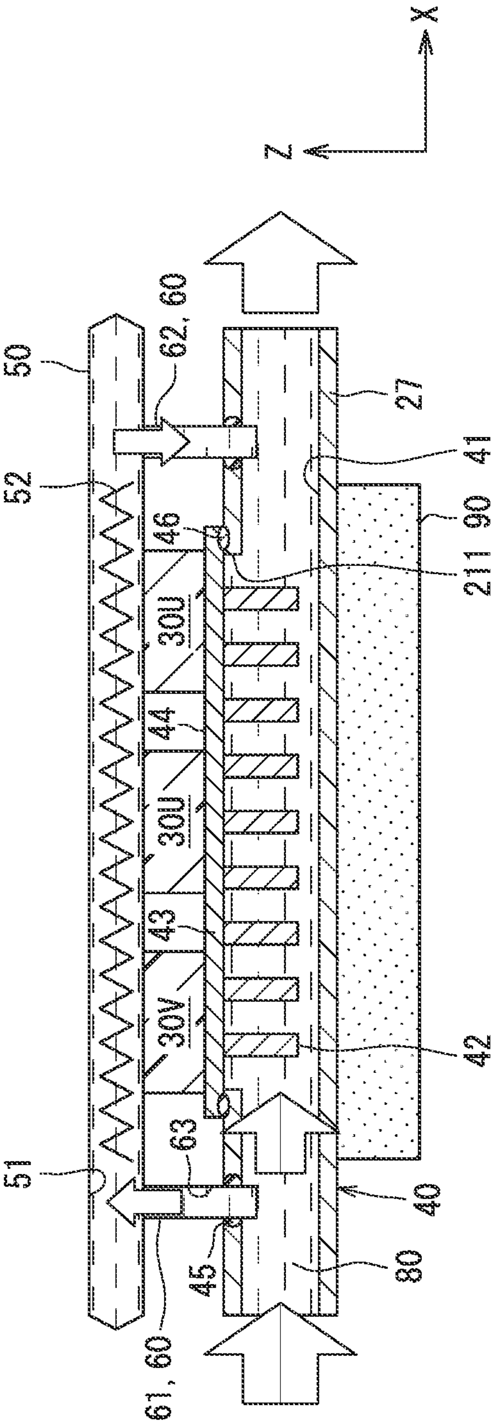
FIG. 14 is a cross sectional diagram taken along the line XIV-XIV in FIG. 12.

FIG. 11 is an equivalent circuit diagram of the power conversion device 4 according to the fourth embodiment. FIG. 12 is a plan view of a structure of the power conversion device 4. FIG. 12 corresponds to FIG. 2. FIG. 13 is a cross sectional diagram along the line XIII-XIII in FIG. 12. FIG. 14 is a cross sectional diagram along the line XIV-XIV in FIG. 12. In this embodiment, the first cooler 40 is configured to have a partition wall of the case 20.

As illustrated in FIG. 11, in this embodiment, the upper-and-lower arm circuit 10 (10U, 10V, 10W) of each phase includes a plurality of series circuits 12. A plurality of series circuits 12 configuring the upper-and-lower arm circuit 10 for one phase are connected in parallel to each other. As an example, the upper-and-lower arm circuit 10 of each phase includes two series circuits 12. The inverter 5 includes six series circuits 12. Each of the six arms 10H and 10L includes four MOSFETs 13 connected in parallel to each other. The four MOSFETs 13 connected in parallel are driven on or off at the same timing by a common gate drive signal (drive voltage).

As illustrated in FIGS. 12 to 14, the case 20 has a side wall 22 and a partition wall 27. The partition wall 27 corresponds to the first wall, and the side wall 22 corresponds to the second wall. The side wall 22 has a cylindrical shape extending in the Z direction. The side wall 22 has a substantially rectangular shape in planar view from the Z direction, for example. The partition wall 27 is provided inside the side wall 22. The partition wall 27 continues on the inner surface of the side wall 22 so as to divide a housing space in the side wall 22 into two in the Z direction. The partition wall 27 has a flat plate shape, for example. The case 20 has, for example, an H-shape in the ZY plane. The case 20 has two housing spaces 20S1 and 20S2 separated by the partition wall 27. The partition wall 27 is disposed so as to enclose all the semiconductor modules 30 and the capacitor 90 in planar view in the Z direction. The opening of the housing space 20S1 is closed by a cover 25, and the opening of the housing space 20S2 is closed by a cover 26.

As illustrated in FIG. 12, the power conversion device 4 includes six semiconductor modules 30. Each semiconductor module 30 provides one series circuit 12, as with the preceding embodiment. The six semiconductor modules 30 are disposed on one side of the partition wall 27, which is the first wall, in the housing space 20S1.

The six semiconductor modules 30 are arranged in two arrays of three each. The two semiconductor modules 30U configuring the upper-and-lower arm circuit 10U for the U-phase are continuously arranged in the X direction to form a first array 301. The two semiconductor modules 30W configuring the upper-and-lower arm circuit 10W for the W-phase are continuously arranged in the X direction to form a second array 302. The semiconductor modules 30W are disposed to face the semiconductor modules 30U in the Y direction. Two semiconductor modules 30V configuring the upper-and-lower arm circuit 10V for the V-phase are arranged in the Y direction. One of the semiconductor modules 30V forms the first array 301, and the other one forms the second array 302.

In this way, only the semiconductor modules 30V are arranged side by side in the Y direction, and the respective semiconductor modules 30U and 30W are arranged side by side in the X direction. The three semiconductor modules 30 forming the first array 301 are arranged in the order of the semiconductor module 30U, the semiconductor module 30U, and the semiconductor module 30V. The three semiconductor modules 30 forming the second array 302 are arranged in the order of the semiconductor module 30W, the semiconductor module 30W, and the semiconductor module 30V.

The semiconductor modules 30 forming the first array 301 and the semiconductor modules 30 forming the second array 302 are disposed so that their side surfaces 32*d* face each other with a predetermined space therebetween. The semiconductor modules 30 forming the second array 302 are set in a position corresponding to a position as a result of rotating the semiconductor modules 30 forming the first array 301 by 180 degrees around the Z-axis. The output terminals 35 of the semiconductor modules 30 forming the first array 301 protrude from the side surfaces 32*d* being surfaces facing the second array 302. The output terminals 35 of the semiconductor modules 30 forming the second array 302 protrude from the side surfaces 32*d* being surfaces facing the first array 301. The power terminals 34N and 34P each protrude from the side surface 32*c* opposite to the side surface 32*d*. Other configurations are similar to those described in the preceding embodiment.

Output conductors 92U, 92V, and 92W are each electrically connected to a corresponding output terminal 35 of the semiconductor module 30. The output conductors 92U, 92V, and 92W are each provided in a form of a plate-shaped metal component, for example. The output conductors 92U, 92V and 92W are sometimes referred to as an output bus bar. The output conductors 92U, 92V, and 92W are each connected to the corresponding output terminal 35 by soldering, resistance welding, laser welding, or the like. The output conductors 92U, 92V, and 92W face the partition wall 27 of the case 20 in the Z direction.

The output conductor 92U is to electrically connect the output terminal 35 of the U-phase semiconductor module 30U. The output conductor 92U extends in the X direction to a side opposite to the side where the semiconductor module 30V is disposed. The output conductor 92V is to electrically connect the output terminal 35 of the V-phase semiconductor module 30V. The output conductor 92V has a portion extending in the X direction from a connected portion with the output terminal 35 to the side where the semiconductor modules 30U and 30W are disposed. The output conductor 92W is to electrically connect the output terminal 35 of the W-phase semiconductor module 30W. The output conductor 92W extends in the X direction to a side opposite to the side where the semiconductor module 30V is disposed. Specifically, the output conductors 92U, 92V, and 92W extend in the same direction from the respective connected portions with the semiconductor modules 30.

The power conversion device 4 of this embodiment includes a current sensor 100. The current sensor 100 detects phase current. The current sensor 100 is disposed in the housing space 20S1. The current sensor 100 is disposed at a location corresponding to the extended ends of the output conductors 92U, 92V, and 92W.

The first cooler 40 includes the partition wall 27 being the first wall, and a flow path provided in the partition wall 27. The flow path may be common to the first array 301 and the second array 302, or may be provided separately for each array. The first cooler 40 of this embodiment includes a flow path 41A and a flow path 41B. The first cooler 40 cools the semiconductor module 30 from a back 32*b* side of the sealing body 32. The configuration of the first cooler 40 is the same as that in the preceding embodiment, except that the first cooler 40 includes the partition wall 27.

The flow path 41A is provided so as to overlap at least part of each semiconductor module 30 in the first array 301 in planar view. The flow path 41B is provided so as to overlap at least part of each semiconductor module 30 in the second array 302 in planar view. The flow paths 41A and 41B are both extended in the X direction. The flow path 41B may be provided in parallel with the flow path 41A to the introduction pipe 23 and the discharge pipe 24, or may communicate with the flow path 41A via an undepicted coupling path. For example, fins 42 are disposed in each of the flow paths 41A and 41B. For example, the heat radiating component 44 may be provided separately for each of the flow paths 41A and 41B, or the base 43 may be common to the two flow paths 41A and 41B.

As illustrated in FIGS. 12 and 13, the power conversion device 4 includes two second coolers 50A and 50B. The second coolers 50A and 50B cool the corresponding semiconductor modules 30 from a one side 32*a* side of the sealing body 32. The second cooler 50A cools the three semiconductor modules 30 in the first array 301. The flow path 51 of the second cooler 50A extends in the X direction and is provided so as to overlap at least part of each semiconductor module 30 in the second array 302 in planar view. The second cooler 50B cools the three semiconductor modules 30 in the second array 302. The flow path 51 of the second cooler 50B extends in the X direction and is provided so as to overlap at least part of each of the three semiconductor modules 30 in the second array 302.

The coupling pipe 60 is provided separately for each of the second coolers 50A and 50B. The power conversion device 4 includes coupling pipes 61A and 62A for the second cooler 50A, and coupling pipes 61B and 62B for the second cooler 50B. The coupling pipes 61A and 62A each include the coupling flow path 63 that communicates with the flow path 41A of the first cooler 40 and the flow path 51 of the second cooler 50A. The coupling pipes 61B and 62B each include the coupling flow path 63 that communicates with the flow path 41B of the first cooler 40 and the flow path 51 of the second cooler 50B.

As in the preceding embodiment, the circuit board 70 is disposed in the housing space 20S1 for the semiconductor modules 30. The circuit board 70 is disposed above the six semiconductor modules 30. The signal terminals 33 of the six semiconductor modules are mounted on the circuit board 70.

The capacitor 90 is disposed in the housing space 20S2. The capacitor 90 is disposed on a surface of the partition wall 27 on a side opposite to the surface on which the semiconductor modules 30 are disposed. The capacitor 90 is disposed so as to overlap the semiconductor modules 30 in the first array 301 and the semiconductor modules 30 in the second array 302 in planar view, for example. The capacitor 90 is disposed so as to overlap the respective flow paths 41A and 41B in planar view.

The power conductor 91N connected to the negative electrode of the capacitor 90 is inserted through a through hole 212 provided in the partition wall 27, and is connected to the power terminal 34N of the semiconductor module 30. The power conductor 91P connected to the positive electrode of the capacitor 90 is inserted through the through hole 212, and is connected to the power terminal 34P of the semiconductor module 30.

The power conversion device 4 of this embodiment has a configuration as a combination of the configurations described in the first embodiment, the second embodiment, and the third embodiment. It is therefore possible to exhibit the effects described in the preceding embodiment.

For example, flow rate of the refrigerant 80 is made different between the respective flow paths 41A and 51 of the first cooler 40 and the second cooler 50A corresponding to the first array 301 of the semiconductor modules 30, and the cross-sectional area of the flow path 41A with a larger flow rate is made larger than that of the flow path 51 with a smaller flow rate. Similarly, flow rate of the refrigerant 80 is made different between the respective flow paths 41B and 51 of the first cooler 40 and the second cooler 50B corresponding to the second array 302 of the semiconductor modules 30, and the cross-sectional area of the flow path 41B with a larger flow rate is made larger than that of the flow path 51 with a smaller flow rate. The first cooler 40, having the wider flow paths 41A and 41B, is formed using part of the case 20 that houses the semiconductor modules 30. The second coolers 50A and 50B, each having the narrower flow path 51, are housed in the case 20 together with the semiconductor modules 30. As a result, it is possible to reduce height of the power conversion device 4 while suppressing an increase in pressure loss.

In this embodiment, the six semiconductor modules 30 are arranged in two arrays of three each. The two semiconductor modules 30U (first modules) configuring the U-phase upper-and-lower arm circuit 10U are disposed in the first array 301. The two semiconductor modules 30W (second modules) configuring the W-phase upper-and-lower arm circuit 10W are disposed in the second array 302. One of the two semiconductor modules 30V (third modules) configuring the V-phase upper-and-lower arm circuit 10V is disposed in the first array 301, and the other one is disposed in the second array 302. In other words, only the semiconductor modules 30V are arranged side by side in the Y direction, and the semiconductor modules 30U and 30W are each arranged side by side in the X direction.

As a result, while the common-phase output terminals 35 are electrically connected by the output conductors 92U, 92V, and 92W, the connection structure between the semiconductor modules 30 and the output conductors 92U, 92V, and 92W forms a roughly U-shape. In the X-direction, one end of the connecting structure is closed by the semiconductor module 30V and part of the output conductor 92V, and the other end is open. The output conductors 92U, 92V, and 92W therefore can be drawn out to the open end side in the X direction. The output conductors 92U, 92V, and 92W can be drawn out in the same direction on the XY plane. As a result, the power conversion device 4 can be reduced in size in the Z direction, i.e., reduced in height.

Positional relationships between the output conductors 92U, 92V, and 92W are not limited. In this embodiment, an extending portion in the X-direction of the output conductor 92V (third conductor) is disposed between the output conductor 92U (first conductor) and the output conductor 92W (second conductor) in the Y direction. The output conductor 92U can be disposed near the semiconductor modules 30U arranged in the X direction in the first array 301, and the output conductor 92W can be disposed near the semiconductor modules 30W arranged in the X direction in the second array 302. As a result, the extending portion of the output conductor 92V can be drawn out through a gap between the output conductors 92U and 92W. Consequently, the power conversion device 4 can be further reduced in height.

The configuration described in this embodiment can be combined with at least one of the configurations described in the first, second, and third embodiments.

The six semiconductor modules 30 are not limitedly disposed as in the above example. The positions of the semiconductor modules 30 may be replaced with each other. For example, instead of the semiconductor modules 30V, the semiconductor modules 30U may be arranged in the Y direction. Instead of the semiconductor modules 30V, the semiconductor modules 30W may be arranged in the Y direction.

The number of series circuits 12 configuring the upper-and-lower arm circuit 10 for one phase, i.e., the number of semiconductor modules 30 of each phase is not limited to two. The number may be an even number of four or more. For example, when the number is four, the first array 301 includes four semiconductor modules 30U arranged in a row and two semiconductor modules 30V arranged in a row. The second array 302 includes four semiconductor modules 30W arranged in a row and two semiconductor modules 30V arranged in a row.

Fifth Embodiment

A fifth embodiment is a modification based on the preceding embodiment, where description of the preceding embodiment can be used as reference.

Figure 15:
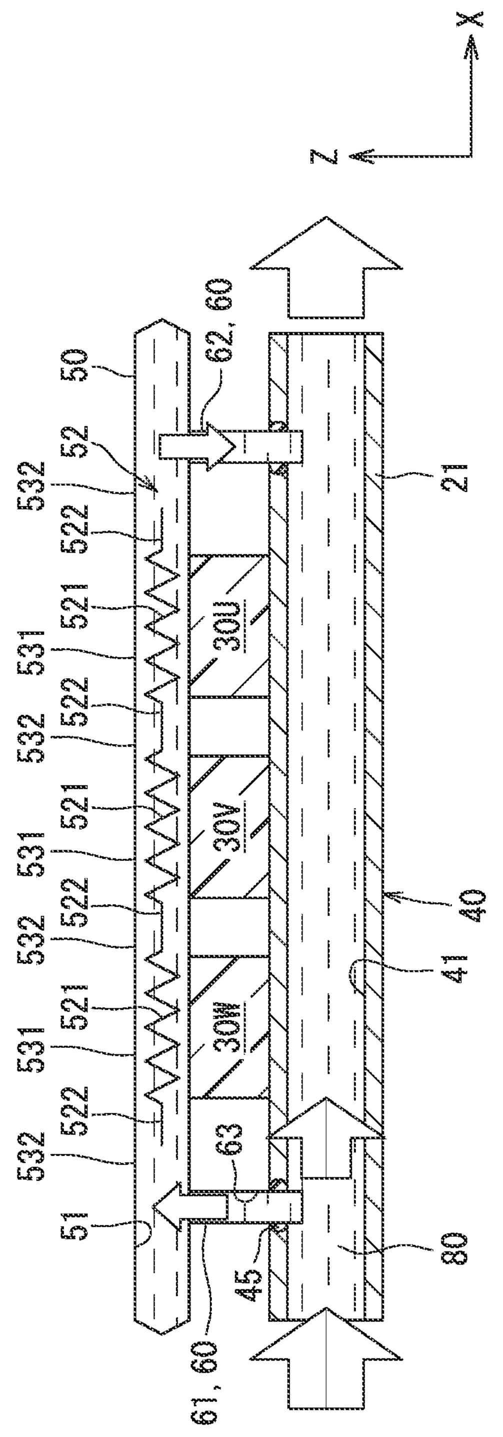
FIG. 15 is a cross sectional diagram illustrating the power conversion device according to a fifth embodiment.

FIG. 15 is a cross sectional diagram illustrating the power conversion device 4 of this embodiment. FIG. 15 corresponds to FIG. 7. The white arrows in FIG. 15 indicate flow directions of the refrigerant.

In the power conversion device 4 of this embodiment, as shown in FIG. 15, the second cooler 50 having the flow path 51 with a lower flow rate has a high heat transfer region 531 and a low heat transfer region 532. In the second cooler 50, the high heat transfer region 531 has a relatively high heat transfer coefficient, and the low heat transfer region 532 has a relatively low heat transfer coefficient. The high heat transfer region 531 has a higher heat transfer coefficient than the low heat transfer region 532. The low heat transfer region 532 has a lower heat transfer coefficient than the high heat transfer region 531.

The high heat transfer region 531 overlaps (i.e., faces) at least part of the semiconductor module 30 in planar view. In a configuration with a plurality of semiconductor modules 30, the high heat transfer region 531 is provided to overlap at least part of each semiconductor module 30. The high heat transfer region 531 of this embodiment is provided so as to enclose the entirety of each semiconductor module 30 in planar view.

In the arrangement direction of the semiconductor modules 30 being the heating elements, the low heat transfer region 532, the high heat transfer region 531, the low heat transfer region 532, the high heat transfer region 531, the low heat transfer region 532, the high heat transfer region 531, and the low heat transfer region 532 are provided in this order. In planar view, the low heat transfer region 532 is provided in each portion between the semiconductor modules 30 adjacent to each other. A low heat transfer region 532 is provided upstream of the plurality of semiconductor modules 30, and another low heat transfer region 532 is also provided downstream thereof.

As an example, in this embodiment, fins are used to make the heat transfer coefficient to be different between the high heat transfer region 531 and the low heat transfer region 532. The heat transfer coefficient can be adjusted by presence or absence of the fins, fin height, fin pitch, or the like. As with the configuration described in the preceding embodiment (FIG. 7), the second cooler 50 includes fins 52 disposed in the flow path 51. The first cooler 40 may or may not have fins 42. As an example, the first cooler 40 of this embodiment includes no fin 42.

As in the preceding embodiment, the fins 52 are disposed in the flow path 51 made of a pair of plates (thin metal plates). The fin 52 has a first fin part 521 and a second fin part 522. The first fin part 521 is a wave-shaped fin (wave fin). The first fin part 521 has a predetermined height in the Z direction. The first fin part 521 is provided with a predetermined pitch in the Y direction. The second fin part 522 is a roughly flat fin (straight fin).

The first fin part 521 and the second fin part 522 may be separate from each other or integrally connected together. The second fin part 522 may be connected to the first fin part 521 by being provided continuously and integrally with the first fin part 521, or may be connected by joining. As an example, in this embodiment, the first fin part 521 is integrally connected to the second fin part 522.

The high heat transfer region 531 is provided with the first fin part 521 in planar view. The low heat transfer region 532 is provided with the second fin part 522 in planar view. In this embodiment, the first fin part 521 is made different in configuration from the second fin part 522 to provide a difference in heat transfer coefficient between the high heat transfer region 531 and the low heat transfer region 532.

The second cooler 50 may have a region with no fin 52 disposed in planar view. The region with no fin 52 of the second cooler 50 has a lower heat transfer coefficient than the low heat transfer region 532. Other configurations of the power conversion device 4 are the same as those described in the preceding embodiment.

According to the power conversion device 4 of this embodiment, the same effects as of the configuration described in the preceding embodiment can be exhibited. For example, in a configuration including a two-stage cooler, the flow rate of the refrigerant 80 is made different between the flow paths 41 and 51, and the cross-sectional area of the flow path 41 with a larger flow rate is made larger than the cross-sectional area of the flow path 51 with a smaller flow rate. Further, the first cooler 40 having the wider flow path 41 is configured using part of the case 20 housing the semiconductor modules 30. It is therefore possible to reduce the height of the power conversion device 4 while suppressing an increase in pressure loss.

Further, in this embodiment, the second cooler 50 with a smaller flow rate has the high heat transfer region 531 and the low heat transfer region 532. The high heat transfer region 531 is provided so as to overlap at least part of the semiconductor module 30 being a heating element. As a result, the semiconductor module 30 can be effectively cooled.

In addition, the low heat transfer region 532 is provided, so that water flow resistance of the flow path 51 can be reduced and flow rate thereof can be increased compared to a configuration where the high heat transfer region 531 occupies the entire heat transfer region. Since the second cooler 50 has a smaller flow rate, even a slight increase in flow rate leads to a large change rate of the flow rate. In other words, the second cooler 50 has high sensitivity to the flow rate. This also allows the semiconductor module 30 to be effectively cooled.

Specifically in this embodiment, in a configuration including the three semiconductor modules 30 (30U, 30V, 30W) configuring the inverter 5, the plurality of regions between adjacent semiconductor modules 30 are formed as the low heat transfer regions 532. This makes it possible to further increase the flow rate of the flow path 51 and effectively cool the semiconductor modules 30. Such an effect can be exhibited in a configuration where three or more semiconductor modules 30 are arranged side by side.

In this embodiment, the fins 52 are used to make the heat transfer coefficient to be different between the high heat transfer region 531 and the low heat transfer region 532. This makes it possible to improve cooling performance while suppressing an increase in pressure loss.

In this embodiment, the first fin part 521 provided in the high heat transfer region 531 and the second fin part 522 provided in the low heat transfer region 532 are integrally connected together. The fin 52 is provided as one component including the first fin part 521 and the second fin part 522. This makes it possible to reduce the number of components and, in turn, reduce costs. In addition, this makes it possible to simplify the manufacturing process, for example, to facilitate positioning in the flow path 51.

The configuration described in this embodiment can be combined with at least one of the configurations described in the first, second, third, and fourth embodiments. For example, in a combination with the second embodiment, height of the first fin part 521 of the high heat transfer region 531 should be made lower than height of the fin 42 disposed in the flow path 41. Alternatively, the pitch of the first fin parts 521 should be made smaller than that of the fins 42.

An example, where the fins having different configurations are used to make the heat transfer coefficient to be different between the high heat transfer region 531 and the low heat transfer region 532, has been non-exclusively given. As described above, presence or absence of the fins, fin height, fin pitch, or the like can be used to make the heat transfer coefficient to be different between the high heat transfer region 531 and the low heat transfer region 532.

Figure 16:
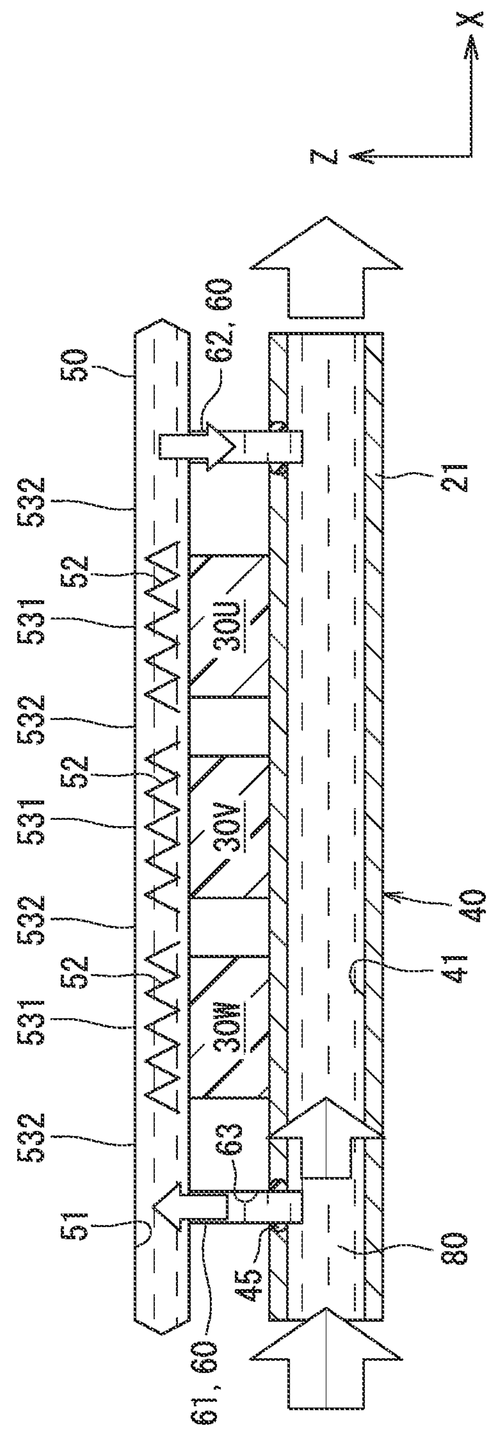
FIG. 16 is a cross sectional diagram illustrating a modification.

For example, in the example shown in FIG. 16, the fins 52 are dispersedly disposed, and the region with the fins 52 is the high heat transfer region 531, and the region with no fin 52 is the low heat transfer region 532. The fin 52 is a wave-shaped fin as with the first fin part 521. The fin 52 is provided so as to overlap at least part of the semiconductor module 30 in planar view. The low heat transfer region 532 is provided at an appropriate position so as not to overlap the semiconductor module 30. In FIG. 16, the high heat transfer region 531 is provided so as to entirely enclose each semiconductor module 30 in planar view. The low heat transfer region 532 is provided, in planar view, between adjacent semiconductor modules 30, on the upstream side of the semiconductor modules 30, and on the downstream side of the semiconductor modules 30.

An example, where the fins are used to make the heat transfer coefficient to be different between the high heat transfer region 531 and the low heat transfer region 532, has been non-exclusively given.

An example, where part of the case 20 housing the semiconductor modules 30 is used to configure the first cooler 40 having the wide flow path 41, has been non-exclusively given. In this embodiment, the first cooler 40 may be provided without using the case 20. In this case, cooling performance can be improved while suppressing an increase in pressure loss.

The disclosure in this description, the drawings, and the like is not limited to the illustrated embodiments. The disclosure encompasses the illustrated embodiments and variations made by those skilled in the art based on the embodiments. For example, the disclosure is not limited to the combinations of the components and/or elements described in the embodiments. The disclosure can be implemented in various combinations. The disclosure can include an additional portion that can be added to each embodiment. The disclosure encompasses each embodiment from which a component and/or an element is/are omitted. The disclosure encompasses substitution or a combination of components and/or elements between one embodiment and another embodiment. The disclosed technical scope is not limited to the description of the embodiments. The several technical scopes disclosed are indicated by the statements of claims and should be further understood to include all modifications within the meaning and scope equivalent to the statements of the claims.

The disclosure in the description, drawings, and the like is not limited by the statements of the claims. The disclosure in the description, drawings, and the like includes the technical ideas described in the claims, and further extends to a more diverse and broader technical ideas than those described in the claims. Therefore, various technical ideas can be extracted from the disclosure of the description, drawings, and the like without being restricted by the statements of the claims.

When an element or phase is referred to as being "on", "coupled", "connected", or "bonded", the element or phase may be directly on, coupled, or connected to another element or phase, or an intervening element or intervening phase may exist between the elements or the phases. In contrast, when one element is referred to as being "directly on," "directly coupled with," "directly connected to," or "directly bonded to" another element or phase, no intervening element or intervening phase exist therebetween. Other words used to describe relationships between elements should be interpreted in a similar manner (e.g., "between" to "directly between," "adjacent" to "directly adjacent," etc.).

As used herein, the term “and/or” includes any and all combinations of one or more of the associated listed items.

The spatially relative terms “in,” “out,” “back,” “under,” “low,” “above,” “high,” and the like are utilized herein to facilitate descriptions that explain the relationship of one element or feature to another element or feature, as shown in the figures. Spatially relative terms can be intended to encompass different directions of the device during use or operation in addition to directions depicted in the figures. For example, when the device in the figure is turned over, an element described as “under” or “directly under” another element or feature is directed “above” such another element or feature. Thus, the term “under” can encompass both the directions, above and under. The device may be oriented in another direction (may be rotated 90 degrees or in another direction) and the spatially relative descriptors used herein will be interpreted accordingly.

The vehicle drive system 1 is not limited to the aforementioned configurations. For example, an example, where one motor generator 3 is provided, has been non-exclusively given. A plurality of motor generators may be provided.

An example, where the power conversion device 4 includes the inverter 5 as the power conversion circuit, has been non-exclusively given. For example, the power conversion device 4 may include a plurality of inverters. The power conversion device 4 may include at least one inverter and a converter. The power conversion device 4 may include only the converter.

The number of the semiconductor modules 30 is not limited to that in the above examples. For example, one semiconductor module 30 may provide one arm 10H or 10L, or may provide six arms 10H and 10L.

The aforementioned two-stage cooling structure, i.e., the double-sided cooling structure using the first cooler 40 and the second cooler 50 may be applied to a heating element, which is another element configuring the power conversion device 4, in addition to or instead of the semiconductor module 30. Examples of such another element include the capacitor, the inductor, and the bus bar.

What is claimed is:

1. A power conversion device, comprising:

a semiconductor module forming a power conversion circuit;

a case having a first wall part on which the semiconductor module is disposed, and a second wall part that is connected to the first wall part and defines a housing space together with the first wall part, the case including a first cooler configured to cool the semiconductor module, the first cooler being a part of the first wall part and including a first flow path formed inside the first wall part, the first flow path allowing a refrigerant to flow through the first flow path;

a second cooler disposed on the semiconductor module and located inside the housing space, the second cooler configured to cool the semiconductor module, the second cooler having a second flow path allowing the refrigerant to flow through the second flow path, the semiconductor module being between the first cooler and the second cooler; and a coupling part having a coupling flow path communicating with the first flow path and the second flow path, wherein a flow rate of the refrigerant flowing through the first flow path is larger than a flow rate of the refrigerant flowing through the second flow path, and a cross-sectional area of the first flow path is larger than a cross-sectional area of the second flow path.

2. The power conversion device according to claim 1, wherein the first flow path is a main flow path, the second flow path is a subsidiary flow path that is branched via the coupling flow path from the first flow path, and a cross-sectional area of the coupling flow path is smaller than the cross-sectional area of the first flow path.

3. The power conversion device according to claim 2, wherein a water flow resistance of the coupling flow path is smaller than a water flow resistance of the second flow path.

4. The power conversion device according to claim 1, wherein the first cooler has a first fin disposed in the first flow path, the second cooler has a second fin disposed in the second flow path, and a height of the first fin is higher than a height of the second fin.

5. The power conversion device according to claim 4, wherein a fin pitch of the second fin is smaller than a fin pitch of the first fin.

6. The power conversion device according to claim 4, wherein the first fin protrudes from a base, and a first seal part between the coupling part and the first cooler is located outside of a second seal part between the base and the first cooler in an extending direction of the first cooler.

7. The power conversion device according to claim 1, wherein the second cooler has a high heat transfer region and a low heat transfer region that is lower in heat transfer coefficient than the high heat transfer region, the first cooler, the semiconductor module, and the second cooler are stacked in a stacking direction, and the high heat transfer region faces at least a part of the semiconductor module in the stacking direction.

8. The power conversion device according to claim 7, wherein the second cooler has a fin disposed in the second flow path, and the fin includes a first fin part disposed in the high heat transfer region, and a second fin part disposed in the low heat transfer region and connected to the first fin part.

9. The power conversion device according to claim 1, wherein the semiconductor module is one of semiconductor modules, the semiconductor modules are horizontally arranged between the first cooler and the second cooler, and a stiffness of the second cooler is lower than a stiffness of the first cooler.

10. The power conversion device according to claim 1, further comprising a passive component disposed in the housing space, electrically connected to the semiconductor module and configured to generate heat when energized, wherein the passive component is disposed on the first wall part and is configured to be cooled by the first cooler.

11. The power conversion device according to claim 10, wherein the first cooler, the semiconductor module, and the second cooler are stacked in a stacking direction, and an upper end of the second cooler is lower in position than an upper end of the passive component in the stacking direction.

12. The power conversion device according to claim 1, wherein the first cooler is not disposed inside the housing space.

13. The power conversion device according to claim 12, wherein the second cooler is not a part of any wall part of the case and the second flow path of the second cooler is not formed inside of any of the wall parts of the case.

14. The power conversion device according to claim 1, wherein the second cooler is not a part of any wall part of the case and the second flow path of the second cooler is not formed inside of any of the wall parts of the case.

* * * * *